(12) United States Patent
Norrie et al.

(10) Patent No.: US 8,397,144 B1
(45) Date of Patent: Mar. 12, 2013

(54) BCH DATA CORRECTION SYSTEM AND METHOD

(75) Inventors: Christopher I. W. Norrie, San Jose, CA (US); Alessia Marelli, Dalmine (IT); Rino Micheloni, Turate (IT); Peter Z. Onufryk, Flanders, NJ (US)

(73) Assignee: Integrated Device Technology, inc., San Jose, CA (US)

( * ) Notice: Subject to any disclaimer, the term of this patent is extended or adjusted under 35 U.S.C. 154(b) by 305 days.

(21) Appl. No.: 12/913,716

(22) Filed: Oct. 27, 2010

Related U.S. Application Data

(60) Provisional application No. 61/374,216, filed on Aug. 16, 2010.

(51) Int. Cl.
*H03M 13/00* (2006.01)
(52) U.S. Cl. ........................................ 714/785
(58) Field of Classification Search ........... 714/774, 714/782–787, 790, 799
See application file for complete search history.

(56) References Cited

U.S. PATENT DOCUMENTS

| | | | | |
|---|---|---|---|---|
| 6,539,515 | B1 * | 3/2003 | Gong | 714/784 |
| 7,206,992 | B2 * | 4/2007 | Xin | 714/782 |
| 7,237,183 | B2 * | 6/2007 | Xin | 714/782 |
| 8,219,894 | B2 * | 7/2012 | Au et al. | 714/784 |
| 8,245,117 | B1 * | 8/2012 | Wu | 714/781 |
| 2004/0181735 | A1 * | 9/2004 | Xin | 714/758 |

* cited by examiner

*Primary Examiner* — Nadeem Iqbal
(74) *Attorney, Agent, or Firm* — Kenneth Glass; Stanley J. Pawlik; Glass & Associates

(57) ABSTRACT

In various embodiments, a data correction system has a data path including search modules. Each of the search modules has a respective bit error capacity for locating a number of data bit errors in a data unit based on a locator polynomial. The data correction system generates a syndrome based on an input data unit, generates a locator polynomial based on the syndrome, and determines a number of data bit errors in the input data unit based on the locator polynomial. Additionally, the data correction system selects one of the search modules having a bit error capacity of at least the number of data bit errors in the input data unit. The selected search module generates an error indicator based on the locator polynomial. The data correction system corrects each data bit error in the input data unit based on the error indicator.

22 Claims, 11 Drawing Sheets

BCH DATA CORRECTION SYSTEM AND METHOD

CROSS-REFERENCE TO RELATED APPLICATION

This application claims benefit of U.S. provisional patent application Ser. No. 61/374,216 filed Aug. 16, 2010 and entitled "High Performance BCH Error Correction Circuits," which is incorporated herein by reference in its entirety.

BACKGROUND

Bose-Chaudhuri-Hochquenghem (BCH) codes are a generalized form of Hamming code often employed in data correction circuits. Typically, these data correction circuits have a data path including a syndrome generator, a locator polynomial generator, a search module, and a correction module. The syndrome generator generates syndromes based on a data unit, and the locator polynomial generator generates a locator polynomial based on the syndromes. The search module locates data bit errors in the data unit by analyzing each root of the locator polynomial. In turn, the correction module corrects the data bit errors in the data unit.

Because the search module has a relatively long propagation delay in comparison to other components in the data path, the search module often acts as a bottleneck for data flow in a data correction circuit. As a result, data throughput of the data correction circuit is constrained by the search module. Moreover, some devices include data channels that compete for access to the data correction circuit. Although these devices have been successful in correcting data bit errors that occur infrequently among the data channels, the data correction circuit acts as a bottleneck for data flow in these devices when data bit errors occur simultaneously in multiple data bit channels. As a result, data throughput is reduced in these devices when data bit errors occur simultaneously in multiple data bit channels. To increase throughput when data bit errors occur simultaneously among multiple data channels, some devices employ multiple independent data correction circuits accessible to the data channels. Although this approach alleviates the bottleneck in a single data correction circuit, the use of multiple data correction circuits in a device increases size and power consumption of the device.

SUMMARY

In various embodiments, a data correction system has a data path including a syndrome generator, a locator polynomial generator, an arbiter, multiple search modules, and a correction module. Each of the search modules has a respective bit error capacity for locating a number of data bit errors in a data unit based on a locator polynomial. Moreover, the search modules are capable of simultaneously locating data bit errors in respective data units. The syndrome generator generates a syndrome based on an input data unit. The locator polynomial generator generates a locator polynomial based on the syndrome and determines a number of data bit errors in the input data unit based on the locator polynomial. The arbiter selects one of the search modules having a bit error capacity of at least the number of data bit errors in the input data unit. The selected search module locates data bit errors in the input data unit based on the locator polynomial and generates an error indicator indicating a location of each data bit error in the input data unit. The correction module corrects each data bit error in the input data unit based on the error indicator.

Because the search modules are capable of simultaneously locating data bit errors in respective data units and generating respective error indicators, throughput of the data correction system is increased in comparison to other systems that have only one search module in a data path. Moreover, size and power consumption of the data correction system is reduced in comparison to other systems that have multiple data paths each of which has a dedicated data correction circuit. In further embodiments, the capacities of the search modules are selected based on an expected distribution of the number of data bit errors in input data units received by the data correction system. In this way, size and power consumption of the data correction system is minimized (e.g., reduced) and throughput of the data correction system is maximized (e.g., increased).

A data correction system, in accordance with one embodiment, includes a locator polynomial generator, an arbiter, search modules, and a correction module. The arbiter is coupled to the locator polynomial generator and the search modules. Additionally, the search modules are coupled to the correction module. Each of the search modules has a respective bit error capacity for locating up to a predetermined number of data bit errors in a data unit based on a locator polynomial associated with the data unit. Moreover, one of the search modules has a different bit error capacity than another one of the search modules. The locator polynomial generator is configured to receive a syndrome associated with an input data unit, generate a locator polynomial based on the syndrome, and determine a number of data bit errors in the input data unit based on the locator polynomial. The arbiter is configured to select one of the search modules having a bit error capacity for locating at least the number of data bit errors in the input data unit and to route the locator polynomial associated with the input data unit to the selected search module. The selected search module is configured to generate an error indicator indicating a location of each data bit error in the input data unit based on the locator polynomial associated with the input data unit. The correction module is configured to correct each of the data bit errors in the input data unit based on the error indicator. In a further embodiment, the selected search module has a bit error capacity that is less than the maximum bit error capacity.

A method, in accordance with one embodiment, includes receiving a syndrome associated with an input data unit, generating a locator polynomial based on the syndrome, and determining a number of data bit errors in the input data unit based on the locator polynomial. The method further includes selecting a search module from a number of search modules based on the number of data bit errors in the input data unit. Each of the search modules has a respective bit error capacity for locating up to a predetermined number of data bit errors in a data unit based on a locator polynomial associated with the data unit. Moreover, the selected search module has a bit error capacity of at least the number of data bit errors in the input data unit. The method also includes routing the locator polynomial associated with the input data unit to the selected search module, generating a error indicator indicating a location of each data bit error in the input data unit based on the locator polynomial associated with the input data unit, and correcting each of the data bit errors in the input data unit based on the error indicator. Because the method selects a search module from a number of search modules based on the number of data bit errors in the input data unit, throughput of the data correction system is increased in comparison to other methods that use only one search module.

BRIEF DESCRIPTION OF THE DRAWINGS

The accompanying drawings are included to provide a further understanding of the invention, and are incorporated

DETAILED DESCRIPTION

In various embodiments, a data correction system has a data path including search modules. Each of the search modules has a respective bit error capacity for locating a number of data bit errors in a data unit based on a locator polynomial. Moreover, the search modules are capable of simultaneously locating data bit errors in respective data units. The data correction system generates a syndrome based on an input data unit, generates a locator polynomial based on the syndrome, and determines a number of data bit errors in the input data unit based on the locator polynomial. Additionally, the data correction system selects one of the search modules having a bit error capacity of at least the number of data bit errors in the input data unit. The selected search module generates an error indicator based on the locator polynomial. The data correction system corrects each data bit error in the input data unit based on the error indicator.

Because the search modules are capable of simultaneously locating data bit errors in respective data units and generating respective error indicators, throughput of the data correction system is increased in comparison to other systems that have only one search module in a data path. Moreover, size and power consumption of the data correction system is reduced in comparison to other systems that have multiple data paths each of which has a dedicated data correction circuit. In various embodiments, the capacities of the search modules are selected based on an expected distribution of the number of data bit errors in input data units received by the data correction system. In this way, size and power consumption of the data correction system is minimized (e.g., reduced) and throughput of the data correction system is maximized (e.g., increased).

Figure 1:
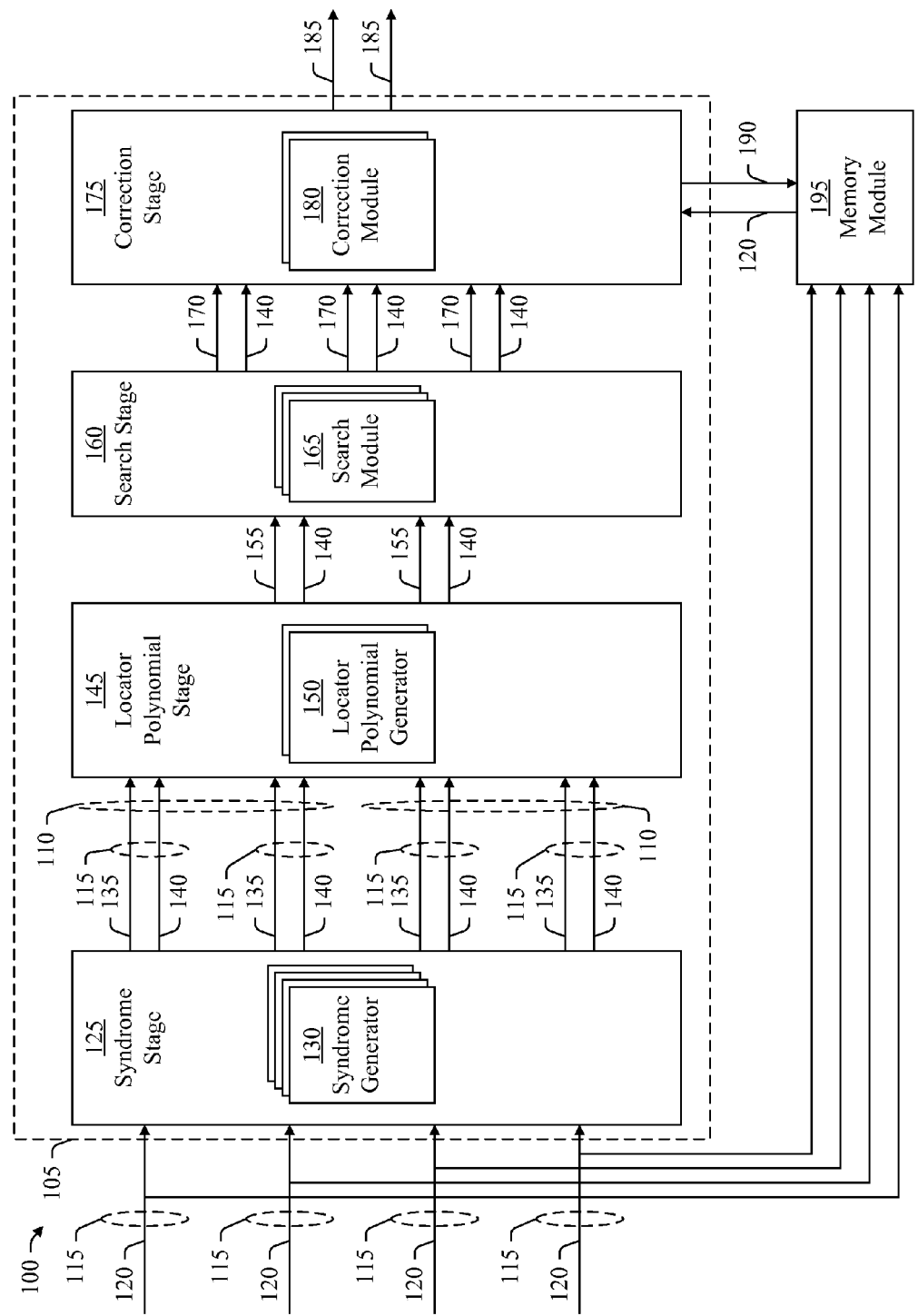
FIG. 1 is a block diagram of a data correction system, in accordance with an embodiment of the present invention.

FIG. 1 illustrates a data correction system 100, in accordance with an embodiment of the present invention. The data correction system 100 includes a data path 105 and a memory module 195. The data path 105 includes a syndrome stage 125, a locator polynomial stage 145, a search stage 160, and a correction stage 175. The locator polynomial stage 145 is coupled (e.g., connected) to the syndrome stage 125 and the search stage 160. The correction stage 175 is coupled (e.g., connected) to the search stage 160 and the memory module 195.

The syndrome stage 125 receives input data units 120 in corresponding data channels 115 and generates syndromes 135 corresponding to the input data units 120. In this way, each of the syndromes is associated with a corresponding data channel 115 and a corresponding input data unit 120. Furthermore, the memory module 195 stores the input data units 120. The locator polynomial stage 145 generates locator polynomials 155 based on the syndromes 135 generated by the syndrome stage 125. The search stage 160 generates error indicators 170 based on the locator polynomials 155 generated by the locator polynomial stage 145. The correction stage 175 corrects data bit errors in the input data units 120 stored in the memory module 195 based on the error indicators 170 generated by the search stage 160.

In some embodiments, the syndrome stage 125 generates descriptors 140 associated with the syndromes 135. The descriptor 140 associated with a syndrome 135 identifies the input data unit 120 corresponding to the syndrome 135 as well as the data channel 115 corresponding to the input data unit 120. In this way, the descriptor 140 is associated with the input data unit 120 and the data channel 115. In these embodiments, the locator polynomial stage 145 receives a syndrome 135 and the descriptor 140 associated with the syndrome 135, generates a locator polynomial 155 based on the syndrome 135, and outputs the locator polynomial 155 along with the descriptor 140. In this way, the descriptor 140 is associated with the locator polynomial 155. Further, the search stage 160 receives a locator polynomial 155 and the descriptor 140 associated with the locator polynomial 155, generates an error indicator 170 based on the locator polynomial 155, and outputs the error indicator 170 along with the descriptor 140. In this way, the descriptor 140 is associated with the error indicator 170.

The correction stage 175 receives an error indicator 170 and the descriptor 140 associated with the error indicator 170, identifies an input data unit 120 stored in the memory module 195 based on the descriptor 140, and corrects data bit errors in the input data unit 120 based on the error indicator 170. Further, the correction stage 175 generates a status indicator 185 indicating a status of the input data unit 120. For example, the status indicator 185 may indicate that the correction module 180 has completed correcting any data bit errors in the input data unit 120. As another example, the status indicator 185 may indicate that a search module 165 did not locate (i.e., identify) any data bit errors in the input data unit 120. In various embodiments, the correction stage 175 may simultaneously correct data bit errors in number of input data units 120 and includes the same number of status indicators 185 for indicating the status of those input data units 120.

In various embodiments, the syndrome stage 125 includes one or more syndrome generators 130, each of which is associated with a data channel 115. Each of the syndrome generators 130 receives an input data unit 120 in the data channel 115 associated with the syndrome generator 130, generates a syndrome 135 based on the input data unit 120, and outputs the syndrome 135 into the same data channel 115. In this way, the syndrome 135 is associated with the input data unit 120 and the data channel 115. In some embodiments, the syndrome generator 130 also generates a descriptor 140 corresponding to the syndrome 135, which identifies the input data unit 120 and the data channel 115.

In various embodiments, the data channels 115 are divided into partitions 110. In the embodiment of FIG. 1, each of the partitions 110 includes two data channels 115. Although four data channels 115 and four syndrome generators 130 and are illustrated in FIG. 1, the data correction system 100 may have any number of data channels 115 and any number of syndrome generators 130 in other embodiments. Although two partitions 110 are illustrated in FIG. 1, the data correction system 100 may have any number of partitions 110 in other embodiments.

In various embodiments, the locator polynomial stage 145 includes one or more locator polynomial generators 150. Each of the locator polynomial generators 150 receives a syndrome 135 generated by a syndrome generator 130, generates a locator polynomial 155 based on the syndrome 135, and outputs the locator polynomial 155. In this way, the locator polynomial 155 is associated with the syndrome 135 as well as both the input data unit 120 and the data channel 115 associated with the syndrome 135. Additionally, the locator polynomial generator 150 determines a number of data bit errors in an input data unit 120 based on the locator polynomial 155 associated with the input data unit 120. For example, the locator polynomial generator 150 may determine the number of data bit errors in an input data unit 120 by determining the degree of the locator polynomial 155. In some embodiments, the locator polynomial generator 150 receives the descriptor 140 associated with the syndrome 135 and outputs the descriptor 140 along with the locator polynomial 155.

In some embodiments, each of the locator polynomial generators 150 is associated with a corresponding partition 110 of the data channels 115. In these embodiments, each of the locator polynomial generators 150 receives syndromes 135 associated with those data channels 115 in the partition 110 associated with the locator polynomial generator 150. Although two locator polynomial generators 150 are illustrated in FIG. 1, the data correction system 100 may have any number of locator polynomial generators 150 in other embodiments.

In various embodiments, one or more of the locator polynomial generators 150 includes an input queue for storing syndromes 135 received by the locator polynomial generator 150. Moreover, size of the input queues may vary among those locator polynomial generators 150. In some embodiments, one or more of the locator polynomial generators 150 includes an output queue for storing locator polynomials 155. Moreover, size of the output queues may vary among those locator polynomial generators 150. In some embodiments, one or more of the syndrome generators 130 in the syndrome stage 125 includes an output queue for storing syndromes 135 generated by the syndrome generator 130. In this way, the syndrome generator 130 may store a syndrome 135 in the output queue of the syndrome generator 130 and start to generate another syndrome 135 before outputting the syndrome 135 stored in the output queue to a locator polynomial generator 150.

In various embodiments, the search stage 160 includes one or more search modules 165. Each of the search modules 165 has a respective bit error capacity for locating a predetermined number of data bit errors in an input data unit 120 based on a locator polynomial 155. In some embodiments, the search modules 165 have various respective capacities for locating a number of data bit errors in an input data unit 120 based on a locator polynomial 155. In these embodiments, the bit error capacity of at least one of the search modules 165 is different from the bit error capacity of another one of the search modules 165.

In various embodiments, a search module 165 generates an error indicator 170 by searching each root of a locator polynomial 155 in a corresponding search cycle to determine the location (i.e., bit position) of a corresponding data bit error in the input data unit 120 associated with the locator polynomial 155. In this way, the search module 165 performs a search of the roots of the locator polynomial 155 in a number of search cycles, each of which includes one or more clock cycles of a clock signal in the data correction system 100. Moreover, the number of clock cycles in the search defines a propagation delay through the search module 165. In some embodiments, one or more of the search modules 165 is capable of searching more than one root of a locator polynomial 155 simultaneously in a search cycle of the search module 165.

In various embodiments, successive searches performed by the search stage 160 may not complete in the same order in which the searches are initiated. For example, a locator polynomial 155 associated with an input data unit 120 having two data bit errors may be assigned to a fast search engine 165 capable of simultaneously searching sixteen data bit errors in a search cycle. Another locator polynomial 155 associated with another input data unit 120 having sixteen data bit errors may be assigned to a slow search engine 165 capable of simultaneously searching two data bit errors in a search cycle. Because the propagation delay of the slow search engine 165 is eight times the propagation delay of the fast search engine 165 in this example, the search performed by the faster search module 165 may complete before the search performed by the slower search module 165 even though the search performed by the slow search module 165 is initiated before the search performed by the fast search module 165 is initiated. In this way, searches performed by the search modules 165 complete out of order with respect to the order in which the searches are initiated by the search modules 165.

In embodiments in which searches performed by the search modules 165 complete out of order, the data correction system 100 maintains consistency of the data units 120 stored in the memory module 195 by selectively reordering correction of data bit errors in data units 120 stored in the memory module 195. For example, the data correction system 100 may receive successive data units 120 in a data channel 120 and the search stage 160 may generate an error indicator 170 for the second data unit 120 (i.e., the subsequent data unit) before generating the error indicator 170 for the first data unit 120 (i.e., the previous data unit). In this example, the correction stage 175 may delay correcting data bit errors in the second data unit 120 stored in the memory module 195 until the correction stage 175 corrects data bit errors in the first data unit 120 stored in the memory module 195. In this way, the correction stage 175 maintains the consistency of the data units 120 stored in the memory module 195.

Each of the search modules 165 receives a locator polynomial 155 generated by a locator polynomial generator 150. In various embodiments, the locator polynomial generator 150 selects a search module 165 having a bit error capacity of at least the number of data bit errors in an input data unit 120 and provides the locator polynomial 155 associated with the input data unit 120 to the selected search module 165. In this way, the search module 165 receiving the locator polynomial 155 has sufficient bit error capacity for locating each data bit error in the input data unit 120.

The search module 165 receiving the locator polynomial 155 locates up to a predetermined number of data bit errors in the input data unit 120 based on the locator polynomial 155, generates an error indicator 170 based on the locator polynomial 155, and outputs the error indicator 170. In this way, the error indicator 170 is associated with the locator polynomial 155 as well as both the input data unit 120 and the data channel 115 associated with the locator polynomial 155. The error indicator 170 indicates the location (i.e., bit position) of data bit errors, if any, in the input data unit 120 associated with the locator polynomial 155. In some embodiments, the search module 165 receives the descriptor 140 associated with the locator polynomial 155 and outputs the descriptor 140 along with the error indicator 170.

In various embodiments, one or more of the search modules 165 includes an input queue for queuing locator polynomials 155 received by the search module 165. Moreover, size of the input queues may vary among those search modules 165. In some embodiments, one or more than one of the search modules 165 includes an output queue for queuing error indicators 170. Moreover, size of the output queues may vary among those search modules 165.

In various embodiments, the correction stage 175 includes one or more correction modules 180. Each of the correction modules 180 receives an error indicator 170 generated by a search module 165 and determines based on the error indicator 170 whether the associated input data unit 120 has any data bit errors. If the correction module 180 determines that the input data unit 120 associated with the error indicator 170 has one or more data bit errors, the correction module 180 reads the input data unit 120 from the memory module 195 and generates a corrected input data unit 190 by correcting each data bit error indicated by the error indicator 170 in the input data unit 120. Further, the correction module 180 stores the corrected input data unit 190 into the memory module 195 by overwriting the input data unit 120 in the memory module 195 with the corrected input data unit 190. In this way, the correction module 180 corrects the data bit errors in the input data unit 120 stored in the memory module 195. In some embodiments, the correction module 180 receives the descriptor 140 associated with the error indicator 170 and reads the input data unit 120 from the memory module 195 based on the descriptor 140. Further, the correction module 180 generates a status indicator 185 indicating a status of the input data unit 120. In various embodiments, one or more of the correction module 180 includes an input queue for queuing error indicators 170 received by the correction module 180. Moreover, size of the input queues may vary among those correction modules 180.

In various embodiments, the number of syndrome generators 130, the number of locator polynomial generators 150, the number of search modules 165, and number of correction modules 180 in the data path 105 may be selected to reduce power consumption of the data correction system 100, reduce size of the data correction system 100 (e.g., area of an integrated circuit), or increase throughput of the data correction system 100, or some combination thereof. For example, the number of locator polynomial generators 150 may be selected based on an expected data rate of input data units 120 received by the syndrome generators 130, and the number of search modules 165 may be selected based on an expected data rate at which the locator polynomial generators 150 generate locator polynomials 155. Further in this example, the number of correction modules 180 may be selected based on an expected data rate at which the search modules 165 generate error indicators 170. Moreover, the number of syndrome generators 130, locator polynomial generators 150, search modules 165, and correction modules 180 may be selected to avoid bottlenecks in the flow of data through the data path 105. For example, the locator polynomial stage 145 may have one or two locator polynomial generators 150, the search stage 160 may have from two to ten search modules 165, and the correction stage 180 may have one correction module 180. In one embodiment, the data correction system 100 receives data units 120 in sixteen data channels 115, the locator polynomial stage 145 has one locator polynomial generator 150, the search stage 160 has eight search modules 165, and the correction stage 180 has one correction module 180.

In various embodiments, the data correction system 100 has a bit error capacity of locating up to a predetermined number of data bit errors in an input data unit 120 based on the locator polynomial 155 associated with the input data unit 120. In these embodiments, at least one of the search modules 165 has a maximum bit error capacity which is the same as the bit error capacity of the data correction system 100. Moreover, the predetermined number of data bit errors each search module 165 is capable of locating in an input data unit 120 may be selected to reduce power consumption of the data correction system 100, reduce size of the data correction system 100 (e.g., area of an integrated circuit), or increase throughput of the data correction system 100, or some combination thereof. Furthermore, the predetermined number of data bit errors each search module 165 is capable of locating in an input data unit 120 may be selected based on an expected distribution of data bit errors in input data units 120 received by the data correction system 100. For example, ninety-nine percent of expected data bit errors in the input data unit 120 may have ten data bit errors or less and the bit error capacity of data correction system 100 may be thirty-eight. In this example, one of the search modules 165 has a bit error capacity of locating up to thirty-eight data bit errors in an input data unit 120 and the remaining search modules 165 are each capable of locating up to ten data bit errors in an input data unit 120. In this way, at least one of the search modules 165 is capable of locating up to thirty-eight data bit errors that may occur in an input data unit 120 and the other search modules 165 are capable of correcting each data bit error in ninety-nine percent of the input data units 120. Because the size and power consumption of each search module 165 having a bit error capacity of ten is less than the size and power consumption of the search module 165 having a bit error capacity of thirty-eight, size and power consumption of the data correction system 100 is minimized (e.g., reduced). Moreover, each of the search modules 165 having a bit error capacity of ten may have a lower propagation delay than the propagation delay of the search module 165 having a bit error capacity of thirty-eight.

As another example, the expected distribution of data bit errors in input data units 120 received by the data correction system 100 may be a binomial distribution, the number of search modules 165 in the data correction system 100 may be four, and the maximum bit error capacity of the data correction system 100 may be thirty-eight. In this example, the curve of the binomial distribution may be partitioned into four sections by dividing the curve at cumulative distributions of twenty-five percent, fifty percent, and seventy-five percent.

Moreover, the cumulative distribution of twenty-five percent represents a number of data bit errors up to five, the cumulative distribution of fifty percent represents a number of data bit errors up to seven, the cumulative distribution of seventy-five percent represents a number of data bit errors up to eight, and a cumulative distribution of one-hundred percent represents a number of data bit errors up to thirty-eight. In this example, one of the search modules 165 is selected to have a bit error capacity of five, another search module 165 is selected to have a bit error capacity of seven, still another search module 165 is selected to have a bit error capacity of eight, and yet another search module 165 is selected to have a bit error capacity of thirty-eight.

In various embodiments, the capacities of the search modules 165 may be selected to reduce power consumption of the data correction system 100, reduce size of the data correction system 100 (e.g., area of an integrated circuit), or increase throughput of the data correction system 100, or some combination thereof. For example, the propagation delay of a search module 165 having a bit error capacity of locating a higher number of data bit errors of the data correction system 100 may be longer than the propagation delay of a search module 165 having a bit error capacity of locating a lower number of data bit errors. As another example, the data correction system 100 may include two search modules 165 each having the same bit error capacity for locating data bit errors but the speed (i.e., propagation delay) of one of these search modules 165 may be faster than the speed of the other search module 165.

In various embodiments, the input data unit 120 is fixed-length block of data. For example, the input data unit 120 may be a block of data having a size of one kilobyte (i.e., 1 KB). In some embodiments, the syndrome generator 130 receives the input data unit 120 as a sequence of data bytes. For example, the syndrome generator 130 may receive each data byte of an input data unit 120 in a corresponding clock cycle of a clock signal in the syndrome generator 130.

In some embodiments, a locator polynomial generator 150 is dedicated to receiving syndromes 135 in which the associated input data units 120 do not have a data bit error. For example, if an input data unit 120 does not have a data bit error, the syndrome 135 associated with the input data unit 120 may have a value of zero. In these embodiments, the locator polynomial generator 150 need not generate a locator polynomial 155 based on the syndrome 135. For example, the locator polynomial generator 150 may generate a locator polynomial 155 including a single coefficient having a value of zero. As a result, the propagation delay of the locator polynomial generator 150 may be less than the propagation delay of other locator polynomial generators 150.

In some embodiments, a search module 165 is dedicated to receiving locator polynomials 155 in which the associated input data units 120 do not have any data bit error. In these embodiments, the search module 165 need not perform a search for any data bit error in the input data unit 120. For example, the search module 165 may generate an error indicator 170 having a value of zero. As a result, the propagation delay of the search module 165 may be less than the propagation delay of other search modules 165.

In some embodiments, a correction module 180 processes (e.g., corrects data bit errors) in only one memory page associated with a given data channel 115 at a time. In these embodiments, the correction module 180 receives the input data units 120 of the memory page, processes (e.g., corrects data bit errors) each of the input data units 120, and generates a status indicator 185 indicating the correction module 180 has processed the memory page. The correction module 180 may then process a next memory page associated with the data channel 115.

In some embodiments, a locator polynomial generator 150 is dedicated to receiving syndromes 135 in which the associated input data units 120 do not have a data bit error and a search module 165 is dedicated to receiving locator polynomials 155 in which the associated input data units 120 do not have any data bit error. In these embodiments, the correction stage 175 tracks the status of input data units 120 including those input data units 120 that do not have any data bit errors, for example for maintaining the consistency of the data units 120 stored in the memory module 195. In further embodiments, the data channels 115 of the data correction system 100 receive memory pages, each of which includes one or more data units 120. In these embodiments, the correction stage 175 maintains a scoreboard for tracking the status of the input data units 120 in a memory page including any data input data units 120 that do not have any data bit errors, as is described more fully herein.

In some embodiments, the correction stage 175 includes a correction module 180 dedicated to correcting data unit errors in a static random access memory (SRAM) and another correction module 180 dedicated to correcting data unit errors in a dynamic random access memory (DRAM). For example, the data correction system 100 may include a memory module 195 including the static random access memory and the dynamic random access memory. As another example, the memory module 195 may include the static random access memory and the dynamic random access memory may be external to the data correction system 100.

In some embodiments, the number of syndrome generators 130 in the syndrome stage 125 is either less than or greater than the number of data channels 115 in the data correction system 100. In various embodiments, the number of locator polynomial generators 150 in the locator polynomial stage 145 is either less than or greater than the number of data channels 115 in the data correction system 100. In various embodiments, the number of search modules 165 in the search stage 160 is either less than or greater than the number of data channels 115 in the data correction system 100. In various embodiments, the number of correction modules 180 in the correction stage 175 is either less than or greater than the number of data channels 115 in the data correction system 100.

In various embodiments, the data correction system 100 is implemented in an integrated circuit of an integrated circuit device which may include an integrated circuit package containing the integrated circuit. In some embodiments, the data correction system 100 is implemented in more than one integrated circuit of an integrated circuit device which may include a multichip package containing the integrated circuits.

Figure 2:
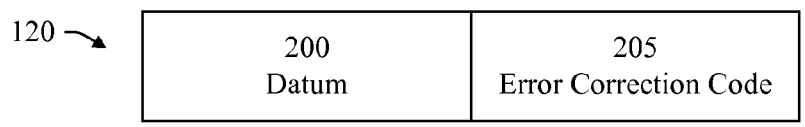
FIG. 2 is a block diagram of an input data unit, in accordance with an embodiment of the present invention.

FIG. 2 illustrates the input data unit 120, in accordance with an embodiment of the present invention. The input data unit 120 includes a datum 200 and an error correction code 205 associated with the datum 200. For example, the input data unit 120 may be a memory block such as a data byte, a data word, a data sector, or the like. In various embodiments, the input data unit 120 may have any number of data bits. In some embodiments, the input data unit 120 is a portion of a memory page. For example, a memory page may have a data size of four kilobytes (4 KB) and include four input data units 120 each having a data size of one kilobyte (1 KB).

Figure 3:
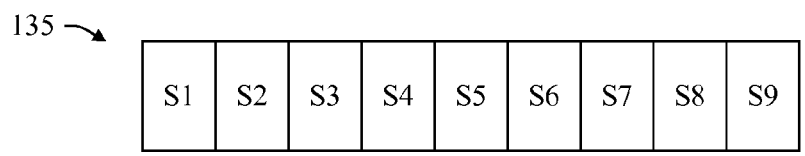
FIG. 3 is a block diagram of a syndrome, in accordance with an embodiment of the present invention.

FIG. 3 illustrates the syndrome 135, in accordance with an embodiment of the present invention. The syndrome 135 includes a sequence of nine syndrome values S1-S9. In other embodiments, the syndrome 135 may include more or fewer than nine syndrome values.

Figure 4:
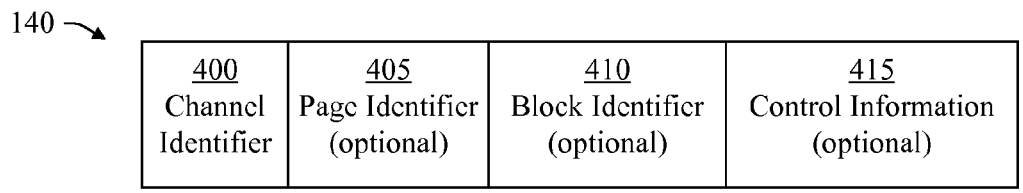
FIG. 4 is a block diagram of a descriptor, in accordance with an embodiment of the present invention.

FIG. 4 illustrates the descriptor 140, in accordance with an embodiment of the present invention. The descriptor 140 includes a channel identifier 400 for identifying the data channel 115 associated with the syndrome generator 130 that generated the descriptor 140. Additionally, the descriptor 140 may include an optional page identifier 405, an optional block identifier 410, optional control information 415, or some combination thereof. The page identifier 405 identifies a memory page including the input data unit 120 associated with the descriptor 140. For example, the page identifier 405 may identify a memory address of the memory page stored in a memory device of a flash storage device. In various embodiments, the syndrome generators 130 generate the page identifiers 405 in the descriptors 140 such that each page identifier 405 of a descriptor 140 present in the data correction system 100 at a given time is unique. For example, the syndrome generators 130 may generate the page identifiers 405 by generating a repeating sequence of numbers having a sufficient length to avoid duplicate page identifiers in the descriptors 140.

The block identifier 410 identifies the input data unit 120 in the memory page identified by the page identifier 405. For example, the block identifier 410 may identify an address of the input data unit 120 in the memory page identified by the page identifier 405. The control information 415 includes data for processing the syndromes 135 associated with the descriptor 140. For example, the control information 415 may indicate the starting memory address in the memory module 195 for storing the input data unit 120 associated with the descriptor 140. As another example, the control information 415 may indicate that data bit errors are to be counted but not corrected in an input data unit 120.

In some embodiments, a memory page includes sectors and the control information 415 of the descriptor 140 includes a read sector mask indicating which sectors of the memory page associated with the descriptor 140 have been written into the memory module 195. For example, a sector may have a data size of an input data unit 120 or a data size of more than one input data unit 120. In these embodiments, the correction module 180 correcting data bit errors in the memory page generates the status indicator 185 for the memory page based on the read sector mask. For example, the correction module 180 may determine based on the read sector mask whether each input data unit 120 of the memory page has been processed by correcting data bit errors in those input data units 120. Further in this example, the correction module 180 generates a status indicator 185 for the memory page indicating that any data bit error in each input data unit 120 of the memory page stored in the memory module 195 according to the sector mask has been corrected.

Figure 5:
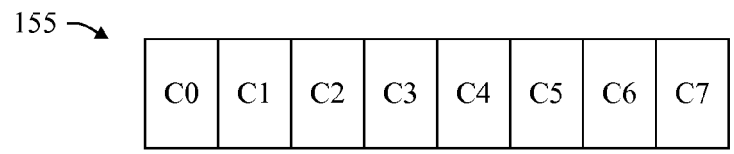
FIG. 5 is a block diagram of a locator polynomial, in accordance with an embodiment of the present invention.

FIG. 5 illustrates the locator polynomial 155, in accordance with an embodiment of the present invention. The locator polynomial 155 includes coefficients C0-C7. In this way, the locator polynomial 155 represents a polynomial function F having the coefficients C0-C7. For example, the polynomial function F may be expressed by the following equation having a degree of seven.

$$F(x) = C0 + C1 * x + C2 * x^2 + C3 * x^3 + C4 * x^3 + C5 * x^5 + C6 * x^6 + C7 * x^7 \quad \text{(Eq. 1)}$$

The locator polynomial generator 150 generates the locator polynomial 155 and determines the number of data bit errors in the input data unit 120 associated with the locator polynomial 155 by determining the degree of the locator polynomial.

The search module 165 locates (e.g., identifies) data bit errors in an input data unit 120 based on the locator polynomial 155 associated with the input data unit 120. In various embodiments, the locator polynomial generator 150 generates the locator polynomial 155 by performing a Berlekamp-Massey algorithm.

In some embodiments, the search module 165 performs a Chien search algorithm to identify roots of the polynomial function represented by the coefficients C0-C7 of the locator polynomial 155. In this process, the search module 165 determines a primitive element a such that the polynomial function F may be expressed by the following equation in which the element i is the bit position (i.e., location) of a data bit in the input data unit 120, exponential powers of α are roots of the polynomial function F, and t is the number of data bit errors that may be detected and corrected in the input data unit 120 based on the locator polynomial 155.

$$F(\alpha^i) = \sum_{j=0}^{t} \Lambda_j \alpha^{ij} = 0 \quad \text{(Eq. 2)}$$

The search module 165 locates data bit errors in the input data unit 120 based on the roots of the polynomial function F, where the exponential powers of the primitive element a yield the bit positions of data bit errors occurring in the input data unit 120. Further, the search module 165 generates the error indicator 170 associated with the input data unit 120 based on the data bit errors located in the input data unit 120. Although the locator polynomial 155 includes eight coefficients C0-C7 in the exemplary embodiment of FIG. 5, the locator polynomial 155 may have more or fewer than eight coefficients in other embodiments.

Figure 6:
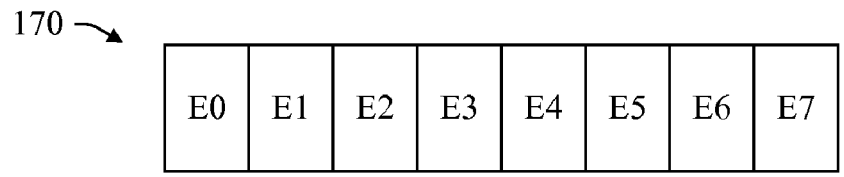
FIG. 6 is a block diagram of an error indicator, in accordance with an embodiment of the present invention.

FIG. 6 illustrates the error indicator 170, in accordance with an embodiment of the present invention. The error indicator 170 includes error bit indicators E0-E7, each of which indicates whether a corresponding data bit in the input data unit 120 associated with the error indicator 170 has a data bit error. For example, each of the error bit indicators E0-E7 may be a data bit having a same bit position as the corresponding data bit in the input data unit 120 associated with the error indicator 170. In this way, each of the error bit indicators E0-E7 identifies the corresponding data bit in the input data unit 120 associated with the error indicator 170. As another example, each of the error bit indicators E0-E7 may be a value indicating the location (i.e., bit position) of the corresponding data bit in the input data unit 120 associated with the error indicator 170. In various embodiments, the correction module 180 generates a corrected input data unit 190 based on an input data unit 120 by negating each data bit in the input data unit 120 indicated as a data bit error in the corresponding error bit of the associated error indicator 170.

Figure 7:
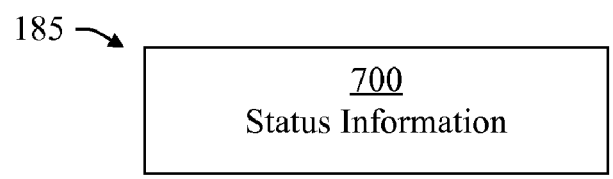
FIG. 7 is a block diagram of a status indicator, in accordance with an embodiment of the present invention.

FIG. 7 illustrates the status indicator 185, in accordance with an embodiment of the present invention. The status indicator 185 includes status information 700 for indicating the status of an associated input data unit 120 stored in the memory module 195. In some embodiments, the status information 700 indicates whether the correction module 180 has completed correcting each data bit error, if any, in the input data unit 120. In some embodiments, the status information 700 indicates whether a search module 165 located (i.e., identified) any data bit error in the input data unit 120.

In various embodiments, the correction module 180 provides the status indicator 185 associated with an input data unit 120 to the data channel 115 associated with the input data unit 120. In some embodiments, the status indicator 185 includes status information 700 for a memory page including one or more input data units 120 indicating whether the correction module 180 has completed correcting each data bit error in the memory page. In further embodiments, the correction module 180 provides the status indicator 185 to the data channel 115 associated with the memory page.

Figure 8:
FIG. 8 is a block diagram of a corrected input data unit, in accordance with an embodiment of the present invention.

FIG. 8 illustrates the corrected input data unit 190, in accordance with an embodiment of the present invention. The corrected input data unit 190 includes a datum 800 and an error correction code 805 associated with the datum 800. In various embodiments, the correction module 180 generates the datum 800 of the corrected input data unit 190 by correcting the data bit error detected in the datum 200 of the input data unit 120. If the datum 200 of the input data unit 120 does not include a data error, the datum 800 of the corrected input data unit 190 is the same as the datum 200 of the input data unit 120.

In some embodiments, the correction module 180 generates the error correction code 805 of the corrected input data unit 190 by correcting the data bit error detected in the error correction code 205 of the input data unit 120. If the error correction code 205 of the input data unit 120 does not include a data error, the error correction code 805 of the corrected input data unit 190 is the same as the error correction code 205 of the input data unit 120.

In some embodiments, the correction module 180 corrects data bit errors in the datum 200 of an input data unit 120 stored in the memory module 195 but does not correct any data bit error in the error correction code 205 of the input data unit 120. In some embodiments, the memory module 195 stores an input data unit 120 by storing the datum 200 portion of the input data unit 120 but does not store the error correction code 205 portion of the input data unit 120.

Figure 9:
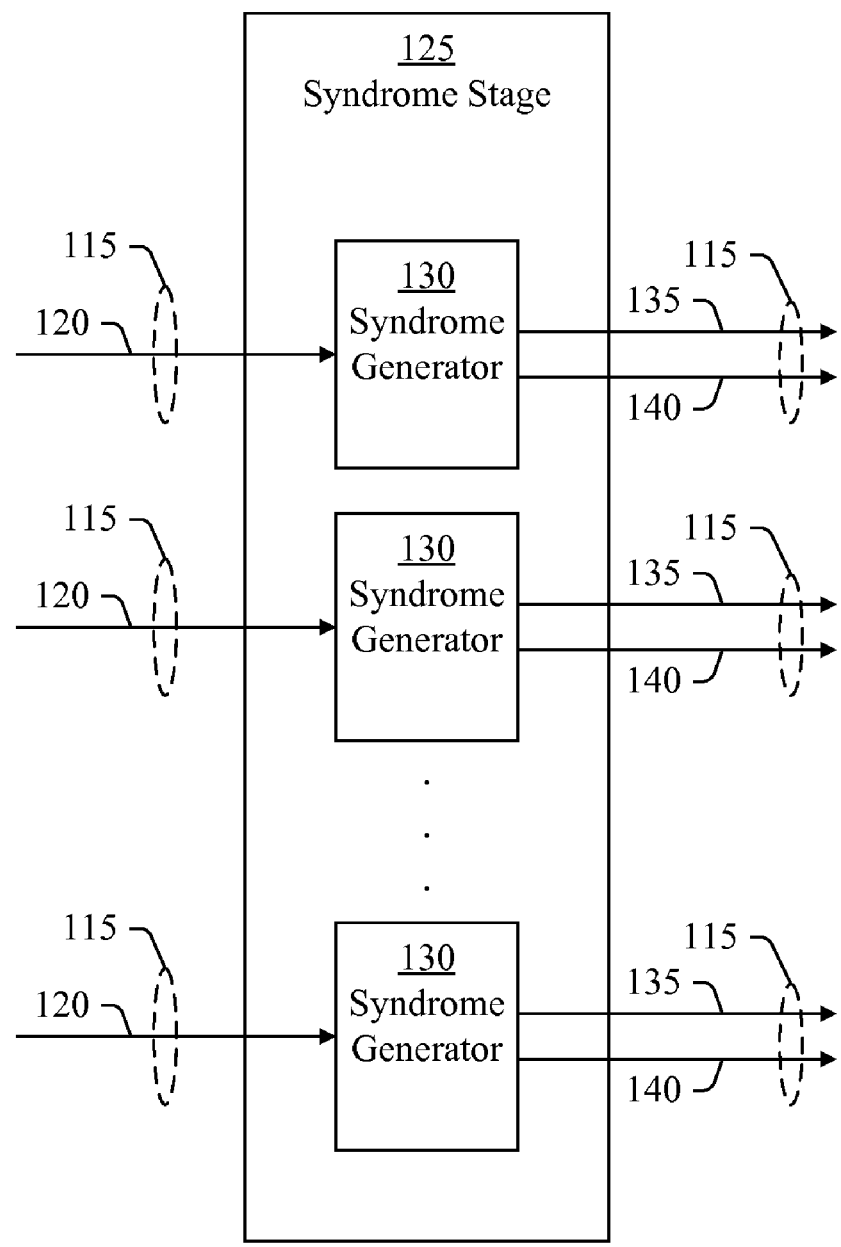
FIG. 9 is a block diagram of a syndrome stage, in accordance with an embodiment of the present invention.

FIG. 9 illustrates the syndrome stage 125, in accordance with an embodiment of the present invention. The syndrome stage 125 includes syndrome generators 130, each of which receives an input data unit 120 in a data channel 115, generates a syndrome 135 and a descriptor 140 associated with the syndrome 135 based on the input data unit 120, and outputs the syndrome 135 and the descriptor 140 in the same data channel 115. In various embodiments, the number of syndrome generators 130 in the syndrome stage 125 is the same as the number of data channels 115 in the data correction system 100. In these embodiments, the syndrome generators 130 correspond to the data channels 115. In other embodiments, the syndrome stage 125 may have either a fewer number of syndrome generators 130 or a greater number of syndrome generators 130 than the number of data channels 115 in the data correction system 100.

Figure 10:
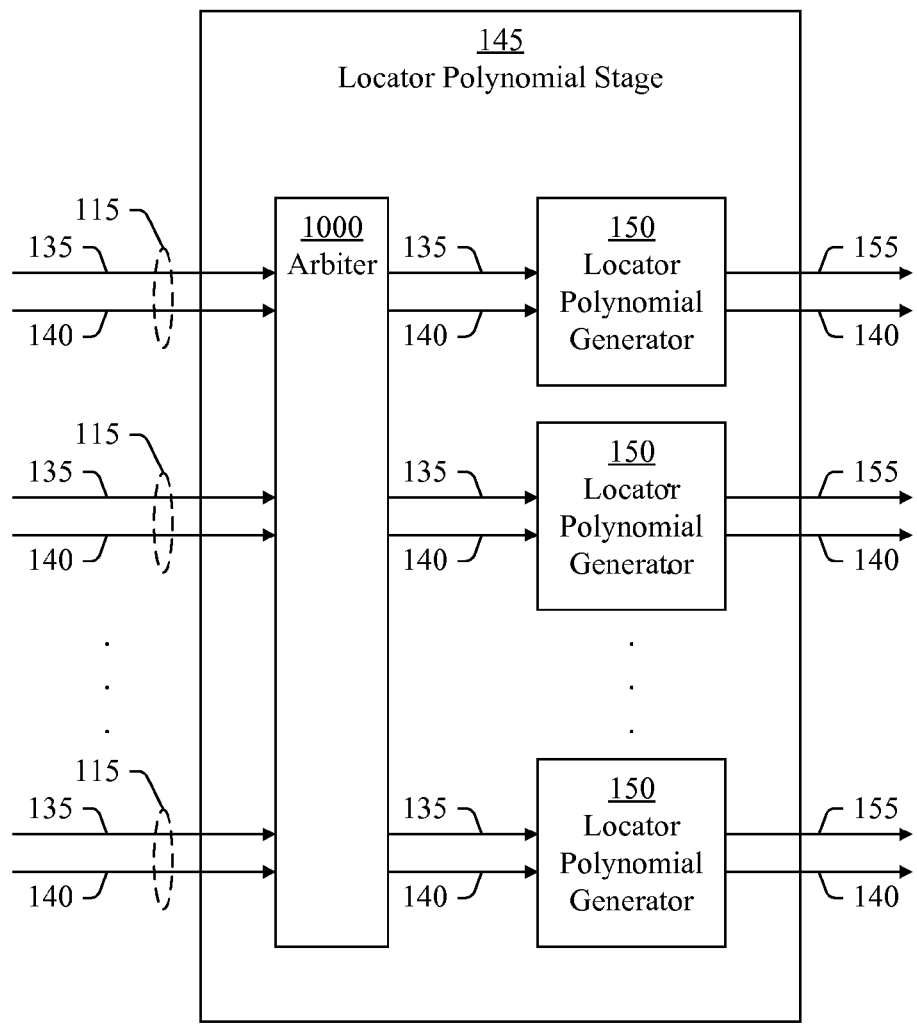
FIG. 10 is a block diagram of a locator polynomial stage, in accordance with an embodiment of the present invention.

FIG. 10 illustrates the locator polynomial stage 145, in accordance with an embodiment of the present invention. The locator polynomial stage 145 includes an arbiter 1000 and locator polynomial generators 150 coupled (e.g., connected) to the arbiter 1000. The arbiter 1000 receives syndromes 135 through the data channels 115, selects a locator polynomial generator 150 for each of the syndromes 135, and provides each syndrome 135 to the locator polynomial generator 150 selected for the syndrome 135. In turn, the selected locator polynomial generator 150 generates a locator polynomial 155 based on the syndrome 135 received from the arbiter 1000 and outputs the locator polynomial 155.

In some embodiments, the arbiter 1000 receives a syndrome 135 and the descriptor 140 associated with the syndrome 135, selects a locator polynomial generator 150 for the syndrome 135, and provides the syndrome 135 and the descriptor 140 associated with the syndrome 135 to the selected locator polynomial generator 150. In these embodiments, the selected locator polynomial generator 150 generates a locator polynomial 155 based on the syndrome 135 and outputs the locator polynomial 155 and the descriptor 140.

In various embodiments, the arbiter 1000 receives syndromes 135 through the data channels 115 and determines an order for providing the syndromes 135 to the locator polynomial generators 150. For example, the arbiter 1000 may determine the order based on a round robin algorithm. In other embodiments, each of the locator polynomial generators 150 is associated with a partition 110. In these embodiments, the arbiter 1000 selects a locator polynomial generator 150 for a syndrome 135 by identifying the partition 110 including the data channel 115 associated with the syndrome 135 and selecting the locator polynomial generator 150 associated with the partition 110.

Figure 11:
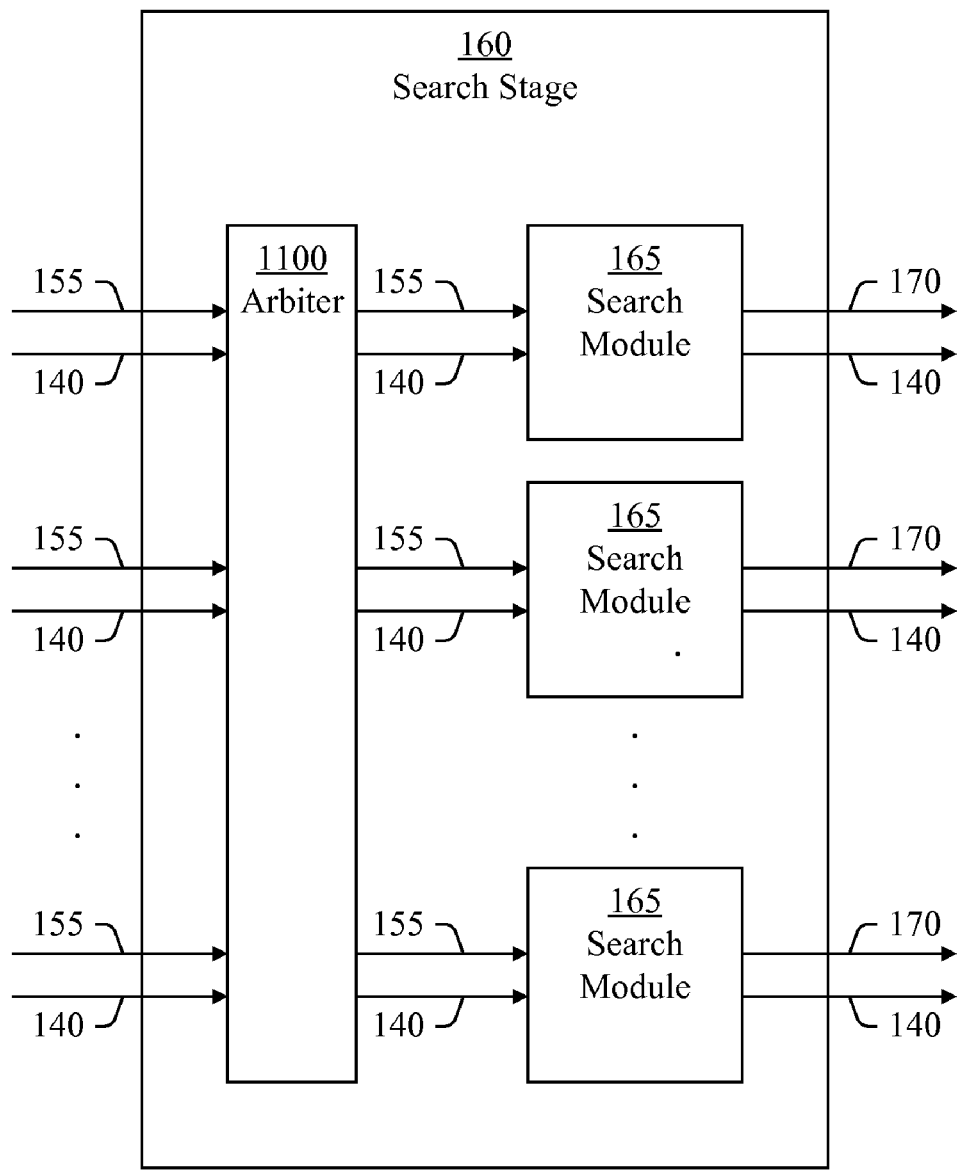
FIG. 11 is a block diagram of a search stage, in accordance with an embodiment of the present invention.

FIG. 11 illustrates the search stage 160, in accordance with an embodiment of the present invention. The search stage 160 includes an arbiter 1100 and search modules 165 coupled (e.g., connected) to the arbiter 1100. The arbiter 1100 receives locator polynomials 155 generated by the locator polynomial generators 150, selects a search module 165 for each of the locator polynomials 155, and provides each locator polynomial 155 to the search module 165 selected for that locator polynomial 155. In turn, the selected search module 165 generates an error indicator 170 based on the locator polynomial 155 received from the arbiter 1100 and outputs the error indicator 170.

In some embodiments, the arbiter 1100 receives a locator polynomial 155 and the descriptor 140 associated with the locator polynomial 155, selects a search module 165 for the locator polynomial 155, and provides the locator polynomial 155 and the descriptor 140 associated with the locator polynomial 155 to the selected search module 165. In these embodiments, the selected search module 165 generates an error indicator 170 based on the locator polynomial 155 and outputs the error indicator 170 and the descriptor 140.

In various embodiments, the arbiter 1100 receives locator polynomials 155 and determines an order for providing the locator polynomials 155 to the search modules 165. For example, the arbiter 1100 may determine the order based on a round robin algorithm. In these embodiments, the arbiter 1100 selects a locator polynomial 155 received by the arbiter 1100 for example based on a round robin algorithm, determines a number of data bit errors in the input data unit 120 associated with the locator polynomial 155, and selects a search module 165 having a bit error capacity of at least the number of data bit errors in the input data unit 120.

In various embodiments, the arbiter 1100 determines (i.e., identifies) each search module 165 in the search stage 160 available to receive a locator polynomial 155. For example, a search module 165 may be available to receive a locator polynomial 155 if the search module 165 has storage capacity for storing the locator polynomial 155. Additionally, the arbiter 1100 identifies each available search module 165 having a bit error capacity of at least the number of data bit errors in the input data unit 120. In one embodiment, the arbiter 1100 selects an identified search module 165 having a lowest bit error capacity. In this way, the arbiter 1100 selects an available search module 165 having a lowest bit error capacity of at least the number of data bit errors in the input data unit 120. In another embodiment, the arbiter 1100 selects an identified search module 165 having a lowest propagation delay. In this way, the arbiter 1100 selects an available search module 165 having a bit error capacity of at least the number of data bit errors in the input data unit 120 and having a lowest propagation delay.

In some embodiments, the arbiter 1100 includes a table indicating the bit error capacity of each search module 165 in the search stage 160. In these embodiments, the locator polynomial generator 150 generating a locator polynomial 155 associated with an input data unit 120 determines the number of data bit errors in the input data unit 120 based on the descriptor 140 associated with the input data unit 120 and provides the number of data bit errors to the arbiter 1100. In turn, the arbiter 1100 identifies each available search module 165 in the search stage 160 having a bit error capacity of at least the number of data bit errors in the input data unit 120 based on the table. In a further embodiment, the table includes a propagation delay indicator for each of the search modules 165 in the search stage 160 indicating a propagation delay of the search module 165. For example, a propagation delay indicator may indicate an expected average propagation delay of the search module 165 for generating an error indicator 170 based on a locator polynomial 155. For example, the arbiter 1100 may select the search module 165 by identifying each of the search modules 165 having a bit error capacity of at least the number of data bit errors in the input data unit 120 and selecting one of the identified search module 165 having a lowest bit error capacity.

Figure 12:
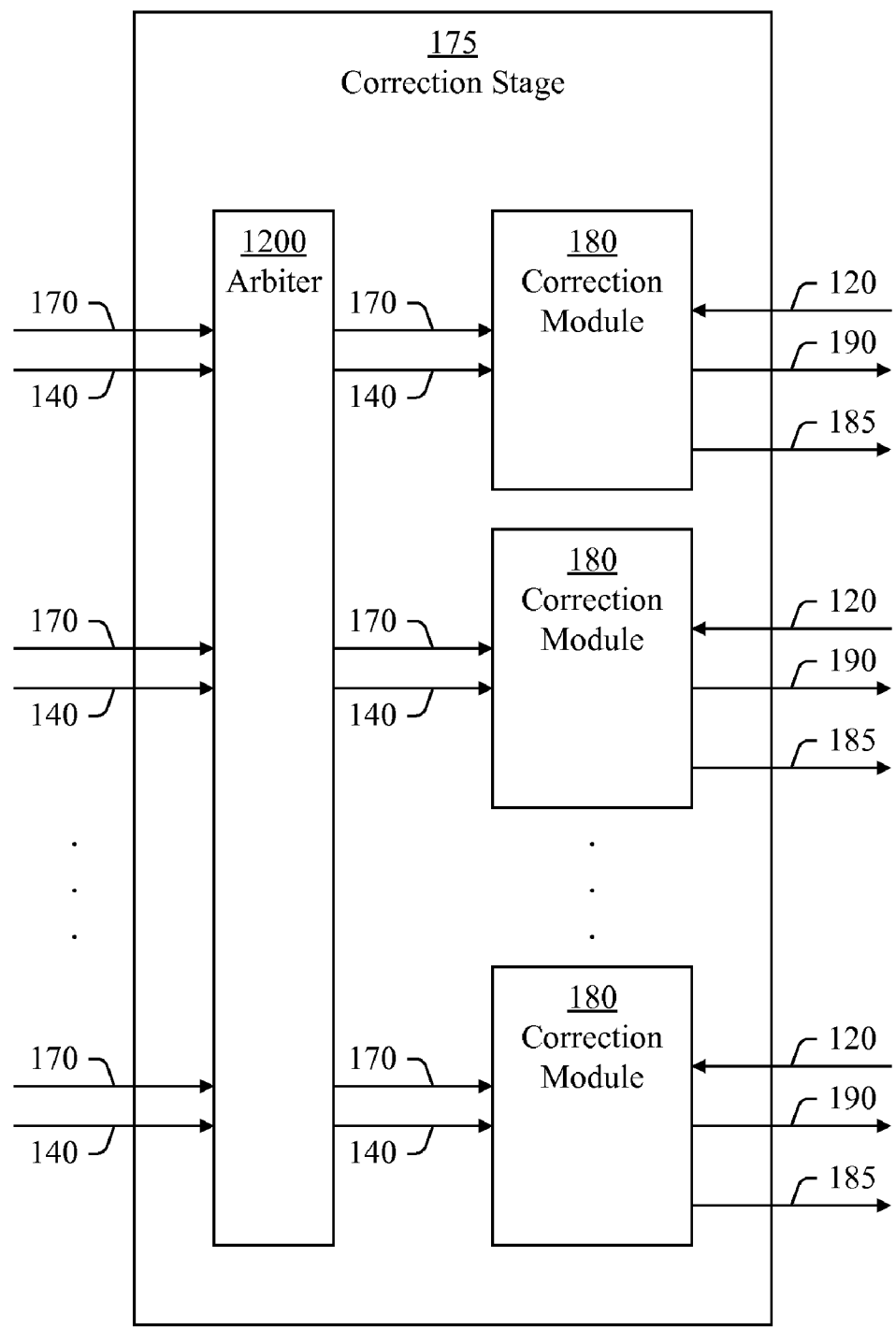
FIG. 12 is a block diagram of a correction stage, in accordance with an embodiment of the present invention.

FIG. 12 illustrates the correction stage 175, in accordance with an embodiment of the present invention. The correction stage 175 includes an arbiter 1200 and correction modules 180 coupled (e.g., connected) to the arbiter 1200. The arbiter 1200 receives error indicators 170 generated by the search modules 165, selects a correction module 180 for each of the error indicators 170, and provides each error indicator 170 to the correction module 180 selected for the error indicator 170. In turn, the selected correction module 180 corrects each data bit error indicated by the error indicator 170 in the input data unit 120 associated with the error indicator 170.

In some embodiments, the arbiter 1200 receives an error indicator 170 and the descriptor 140 associated with the error indicator 170, selects a correction module 180 based on the error indicator 170, and provides the error indicator 170 and the descriptor 140 associated with the error indicator 170 to the selected correction module 180. In turn, the selected correction module 180 reads the input data unit 120 associated with the error indicator 170 from the memory module 195 based on the descriptor 140, corrects each data bit error indicated by the error indicator 170 in the input data unit 120 associated with the error indicator 170, and replaces the input data unit 120 stored in the memory module 195 with the corrected input data unit 190.

In various embodiments, the arbiter 1200 receives error indicators 170 generated by the search modules 165 and determines an order for providing the error indicators 170 to the correction modules 180. For example, the arbiter 1200 may determine the order based on a round robin algorithm. In other embodiments, each of the correction modules 180 is associated with a partition 110. In these embodiments, the arbiter 1200 selects a correction module 180 for an error indicator 170 by identifying the partition 110 including the data channel 115 associated with the error indicator 170 and selecting the correction module 180 associated with the partition 110.

In some embodiments, the arbiter 1200 selects correction modules 180 to avoid deadlocks in the data correction system 100 or to maintain data integrity (e.g., data consistency) of the input data units 120 stored in the memory module 195, or both. For example, the correction stage 175 may maintain status information for only one memory page per data channel 115 at a given time. In these embodiments, the arbiter 1200 may receive an error indicator 170 for an input data unit 120 of a subsequent memory page associated with a data channel 115 before providing an error indicator 170 for each data unit 120 of a previous memory page associated with the data channel 115 to a correction module 180. Moreover, the arbiter 1200 holds (e.g., stores) the error indicator 170 associated with the input data unit 120 of the subsequent memory page until the arbiter 1200 provides an error indicator 170 for each data unit 120 of the previous memory page to a correction module 180. In this way, the arbiter 1200 maintains the data integrity (e.g., data consistency) of both the previous memory page and the subsequent memory page.

In some embodiments, the correction modules 180 receive a completion indicator (e.g., signal) indicating when a memory block including input data units 120 has been written into the memory module 195 and is available for correction. For example, the correction modules 180 may receive the completion indicator from the memory module 195. As another example, the correction modules 180 may receive the completion indicator through a data channel 115 from a component or device external of the data correction system 100. In further embodiments, a correction module 180 does not correct any data bit errors in an input data unit 120 until the memory block including the input data units 120 is stored in the memory module 195 and the correction module 180 receives the completion indicator indicating the memory block has been written into the memory module 195. In some embodiments, the completion indicator indicates the data channel 115 associated with the syndrome generator 130 that received the input data unit 120.

Figure 13:
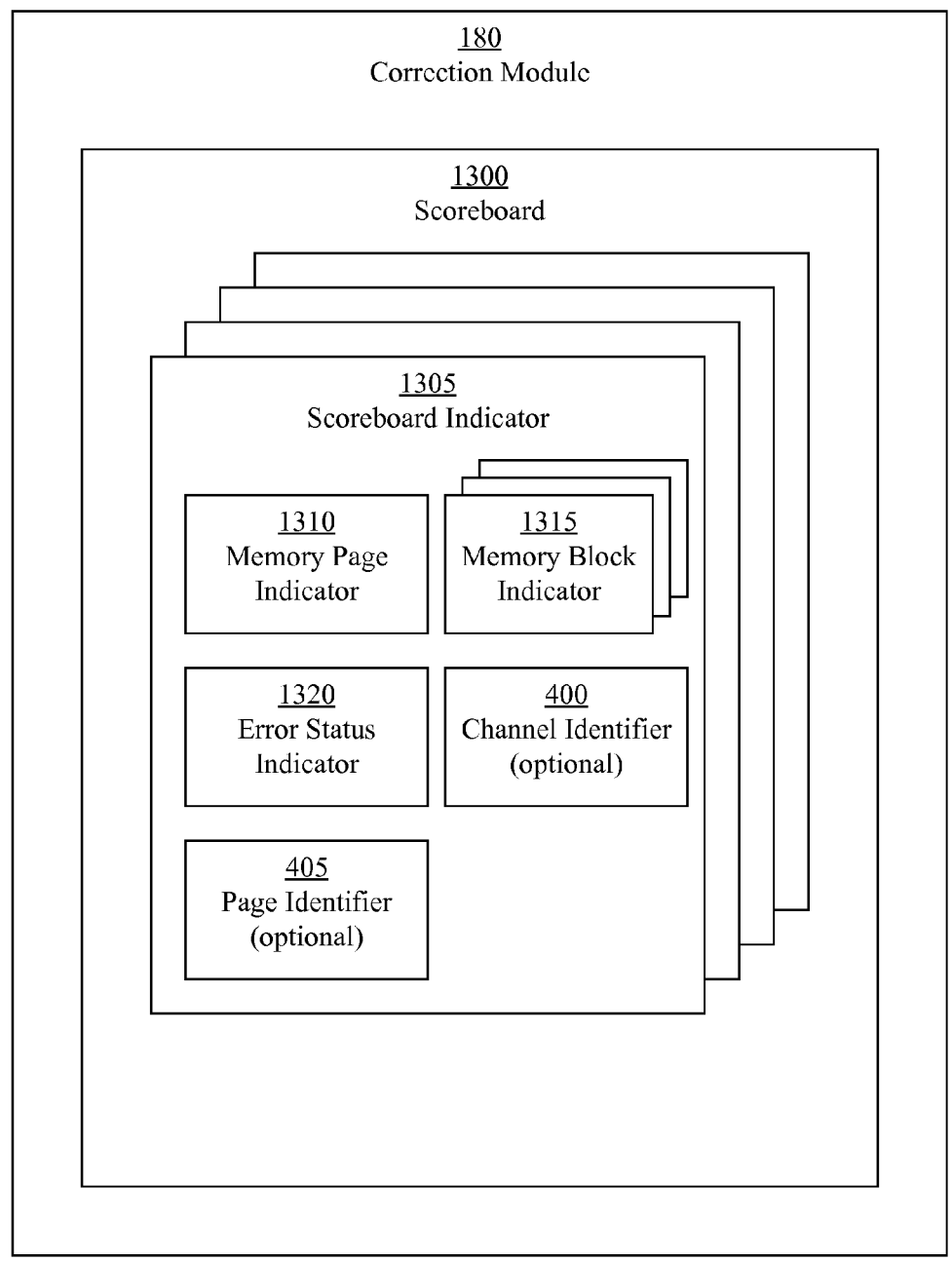
FIG. 13 is a block diagram of a correction module, in accordance with an embodiment of the present invention.

FIG. 13 illustrates the correction module 180, in accordance with an embodiment of the present invention. In this embodiment, the correction module 180 includes a scoreboard 1300 for tracking the status of a memory page including input data units 120 stored in the memory module 195. Additionally, the scoreboard 1300 tracks the status of each input data unit 120 (i.e., memory block) in the memory page stored in the memory module 195. As illustrated in FIG. 13, the scoreboard 1300 includes scoreboard indicators 1305 each of which includes a memory page indicator 1310 and one or more memory block indicators 1315.

The memory page indicator 1310 of a scoreboard indicator 1305 is associated with a memory page stored in the memory module 195 and is associated with the data channel 115 that is associated with each input data unit 120 in the memory page. Moreover, the memory page indicator 1310 indicates whether each data bit error in each of the input data units 120 in the memory page has been corrected in the memory module 195.

Each of the memory block indicators 1315 is associated with an input data unit 120 of a memory page stored in the memory module 195. Moreover, the memory block indicator 1315 indicates whether each data bit error in the input data unit 120 associated with memory block indicator 1315 has been corrected in the memory module 195. In some embodiments, the scoreboard 1300 of the correction module 180 updates the memory block indicators 1315 of a scoreboard indicator 1305 to indicate which data units 120 of the memory page identified by the memory page indicator 1310 of the scoreboard indicator 1305 have been stored into the memory module 195 and are ready for correction of any data bit errors. Furthermore, the arbiter 1200 of the correction stage 175 selects correction modules 180 based on the memory block indicators 1315 of the scoreboard indicator 1305. In these embodiments, the arbiter 1200 does not provide an error indicator 170 associated with an input data unit 120 to a correction module 180 if the memory block indicator 1315 associated with the input data unit 120 indicates that the input data unit 120 has not been stored in the memory module 195.

In some embodiments, the scoreboard indicator 1305 includes an optional error status indicator 1320 indicating a number of data bit errors corrected in the memory page identified by the memory page indicator 1310. In further embodiments, the error status indicator 1320 indicates a number of data bit errors corrected in each of the input data units 120 identified by the memory block indicators 1315.

In various embodiments, the scoreboard 1300 updates the memory page indicators 1310 and the memory block indicators 1315 based on descriptors 140 received by the correction stage 175. In some embodiments, the scoreboard 1300 updates a scoreboard indicator 1305 by writing a channel identifier 400 of a descriptor 140 into the scoreboard indicator 1305. In this way, the scoreboard indicator 1305 includes the channel identifier 400 and the scoreboard 1300 associates the scoreboard indicator 1305 with the data channel 115 identified by the channel identifier 400. In some embodiments, the scoreboard 1300 updates a scoreboard indicator 1305 by writing a page identifier 405 of the descriptor 140 into the scoreboard indicator 1305. In this way, the scoreboard indicator 1305 includes the page identifier 405 and the scoreboard 1300 associates the scoreboard indicator 1305 with the memory page identified by the page identifier 405.

In some embodiments, the scoreboard 1300 includes one scoreboard indicator 1305 per data channel 115. In these embodiments, the scoreboard indicators 1305 correspond to the data channels 115. In other embodiments, the scoreboard 1300 includes more than one memory page indicator 1310 per data channel 115. In some embodiments, each of the correction modules 180 includes a scoreboard 1300. In other embodiments, the correction stage 175 includes a scoreboard 1300 (i.e., a global scoreboard). For example, the scoreboard 1300 may be coupled (e.g., connected) to each of the correction modules 180. In these embodiments, each of the correction modules 180 updates the scoreboard 1300.

Figure 14:
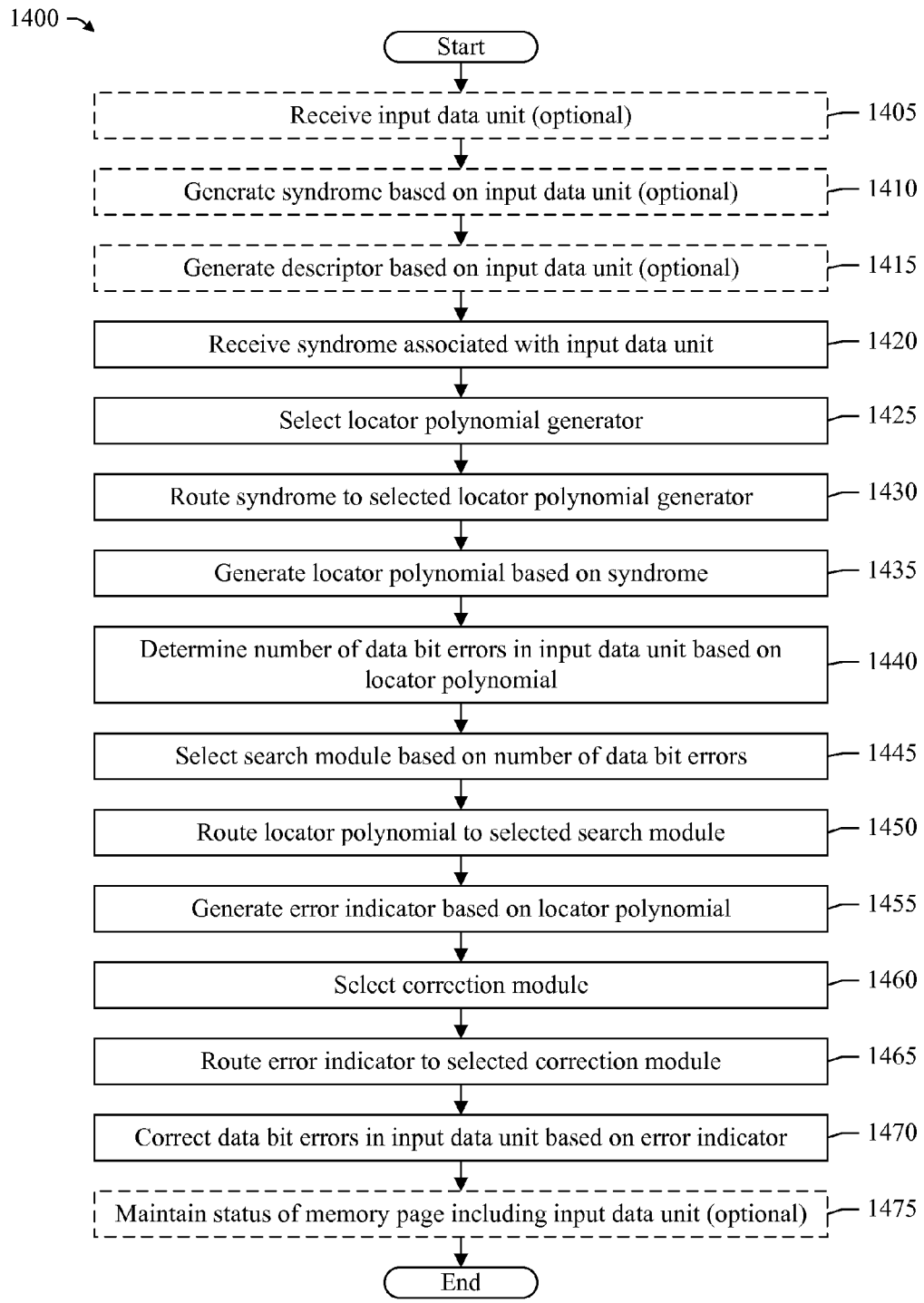
FIG. 14 is a flow chart for a method of correcting data bit errors, in accordance with an embodiment of the present invention.

FIG. 14 illustrates a method 1400 of correcting data bit errors in a data unit, in accordance with an embodiment of the present invention. In optional step 1405, an input data unit is received. In various embodiments, a syndrome generator 130 receives an input data unit 120 from a data channel 115 associated with the syndrome generator 130. The method 1400 then proceeds to step 1410.

In optional step 1410, a syndrome is generated based on the input data unit. In various embodiments, the syndrome generator 130 receiving the input data unit 120 generates a syndrome 135 based on the input data unit 120. In this way, the syndrome 135 is associated with the input data unit 120. The method 1400 then proceeds to step 1415.

In optional step 1415, a descriptor is generated based on the input data unit. In various embodiments, the syndrome generator 130 receiving the input data unit 120 generates a descriptor 140 associated with the syndrome 135 generated by the syndrome generator 130. In this way, the descriptor 140 is associated with the syndrome 135. The method 1400 then proceeds to step 1420.

In step 1420, the syndrome associated with the data unit is received. In various embodiments, a locator polynomial generator 150 receives the syndrome 135 associated with the input data unit 120. In some embodiments, the arbiter 1000 in the locator polynomial stage 145 receives the syndrome 135 from the syndrome generator 130, selects a locator polynomial generator 150, and provides the syndrome 135 to the locator polynomial generator 150. In this way, the locator polynomial generator 150 receives the syndrome 135. In some embodiments, the locator polynomial generator 150 also receives the descriptor 140 along with the syndrome 135. The method 1400 then proceeds to step 1425.

In step 1425, a locator polynomial generator is selected. In various embodiments, the arbiter 1000 of the locator polynomial stage 145 selects a locator polynomial generator 150. For example, the arbiter 1000 may identify each available locator polynomial generator 150 and select one of the available locator polynomial generators 150. The portion of the method 1400 then proceeds to step 1430.

In step 1430, the syndrome is routed to the selected locator polynomial generator 150. In various embodiments, the arbiter 1000 of the locator polynomial stage 145 routes the syndrome 135 to the selected locator polynomial generator 150. In some embodiments, the arbiter 1000 also routes the descriptor 140 associated with the syndrome 135 to the selected locator polynomial generator 150. The portion of the method 1400 then proceeds to step 1435.

In step 1435, a locator polynomial is generated based on the syndrome. In various embodiments, the locator polynomial generator 150 receiving the syndrome 135 generates a locator polynomial 155 based on the syndrome 135. Further, the locator polynomial generator 150 outputs the locator polynomial 155. In some embodiments, the locator polynomial generator 150 also outputs the descriptor 140 associated with the syndrome 135. In this way, the descriptor 140 is associated with the locator polynomial 155. The method 1400 then proceeds to step 1440.

In step 1440, the number of data bit errors in the input data unit is determined based on the locator polynomial. In various embodiments, the locator polynomial generator 150 generating the locator polynomial 155 determines the number of data bit errors in the input data unit 120 based on the locator polynomial 155. For example, the locator polynomial generator 150 may determine the number of data bit errors in the input data unit 120 by determining the degree of the locator polynomial 155. The method 1400 then proceeds to step 1445.

In step 1445, a search module is selected based on the number of data bit errors in the input data unit. In various embodiments, the arbiter 1100 in the search stage 160 selects a search module 165 having a bit error capacity of at least the number of data bit errors in the input data unit 120. The method 1400 then proceeds to step 1450.

In step 1450, the locator polynomial is routed to the selected search module. In various embodiments, the arbiter 1100 in the search stage 160 routes the locator polynomial 155 to the selected search module 165. The method 1400 then proceeds to step 1455.

In step 1455, an error indicator is generated based on the locator polynomial. In various embodiments, the search module 165 receiving the locator polynomial 155 generates an error indicator 170 based on the locator polynomial 155. Further, the search module 165 outputs the locator polynomial 155. In some embodiments, the search module 165 also outputs the descriptor 140 associated with the locator polynomial 155. In this way, the descriptor 140 is associated with the error indicator 170. The method 1400 then proceeds to step 1460.

In step 1460, a correction module is selected. In various embodiments, the arbiter 1200 of the correction stage 175 selects a correction module 180. For example, the arbiter 1200 may identify each available correction module 180 and select one of the available correction modules 800. The portion of the method 1400 then proceeds to step 1465.

In step 1465, the error indicator 170 is routed to the selected correction module 180. In various embodiments, the arbiter 1200 of the correction stage 175 routes the error indicator 170 to the correction module 180. The portion of the method 1400 then proceeds to step 1470.

In step 1470, data bit errors in the input data unit are corrected based on the error indicator. In various embodiments, the correction module 180 receiving the error indicator 170 corrects data bit errors in the input data unit 120 based on the error indicator 170. For example, the correction module 180 may read the input data unit 120 from the memory module 195, generate a corrected input data unit 190 by negating each data bit in the input data unit 120 indicated as a data bit error in the corresponding error bit of the associated error indicator 170, and replace the input data unit 120 with the corrected input data unit 190 in the memory module 195. The method 1400 then proceeds to step 1475.

In optional step 1475, status of the memory page including the input data unit is maintained. In various embodiments, the scoreboard 1300 of the correction module 180 maintains a status of the memory page including the input data unit 120 by updating a scoreboard indicator 1305 associated with the memory page. For example, the scoreboard 1300 of the correction module 180 may update the memory block indicator 1315 associated with the input data unit 120 to indicate that each data bit error is corrected in the input data unit 120. Further in this example, the scoreboard 1300 of the correction module 180 may update the memory page indicator 1310 associated with the memory page including the input data 210 to indicate that each data bit error is corrected in the memory page. The method 1400 then ends.

In various embodiments, the method 1400 illustrated in FIG. 14 may include more or fewer than the steps 1405-1475 illustrated in FIG. 14 and described above. In some embodiments, the steps 1405-1475 of the method 1400 illustrated in FIG. 14 may be performed in a different order than the order illustrated in FIG. 14 and described above. In some embodiments, some of the steps 1405-1475 of the method 1400 illustrated in FIG. 14 may be performed in parallel or substantially simultaneously. In various embodiments, one or more of the steps 1405-1475 may be performed more than once in the method 1400 illustrated in FIG. 14.

Figure 15:
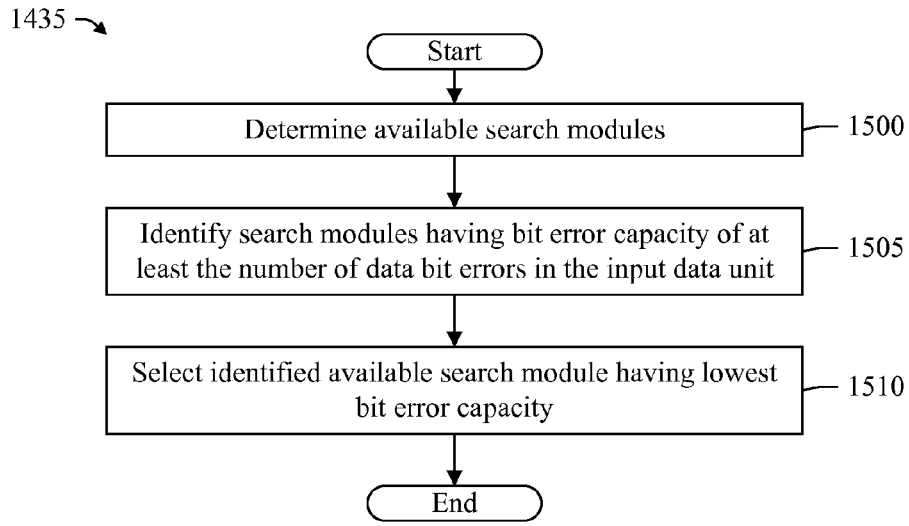
FIG. 15 is a flow chart for a portion of a method of correcting data bit errors, in accordance with an embodiment of the present invention.

FIG. 15 illustrates a portion of the method 1400 of correcting data bit errors in a data unit, in accordance with an embodiment of the present invention. The portion of the method 1400 illustrated in FIG. 15 is an embodiment of the step 1435 of the method 1400 in which a search module is selected based on the number of data bit errors in the input data unit. In step 1500, available search modules are identified. In various embodiments, the arbiter 1100 determines each available search module 165 in the search stage 160. For example, the arbiter 1100 may determine each search module 165 in the search stage 160 available to receive a locator polynomial 155. The portion of the method 1400 then proceeds to step 1505.

In step 1505, search modules having a bit error capacity of at least the number of data bit errors in the input data unit are identified. In various embodiments, the arbiter 1100 identifies each search module 165 in the search stage 160 having a bit error capacity of at least the number of data bit errors in the input data unit 120. In some embodiments, the arbiter 1100 identifies each available search module 165 in the search stage 160 having a bit error capacity of at least the number of data bit errors in the input data unit 120. The portion of the method 1400 then proceeds to step 1510.

In step 1510, an available identified search module having a lowest bit error capacity is selected. In various embodiments, the arbiter 1100 selects an available identified search module 165 having a lowest bit error capacity. For example, the arbiter 1100 may select a search module 165 having a lowest bit error capacity from among search modules 165 determined to be available in step 1500 and identified as having a bit error capacity of at least the number of data bit errors in the input data unit 120 in step 1505. This portion of the method 1400 then ends.

In various embodiments, the portion of the method 1400 illustrated in FIG. 15 may include more or fewer than the steps 1500-1510 illustrated in FIG. 15 and described above. In some embodiments, the steps 1500-1510 of the portion of the method 1400 illustrated in FIG. 15 may be performed in a different order than the order illustrated in FIG. 15 and described above. For example, step 1505 may be performed before step 1500. In some embodiments, some of the steps 1500-1510 of the portion of the method 1400 illustrated in FIG. 15 may be performed in parallel or substantially simultaneously. In various embodiments, one or more of the steps 1500-1510 may be performed more than once in the portion of the method 1400 illustrated in FIG. 15.

Figure 16:
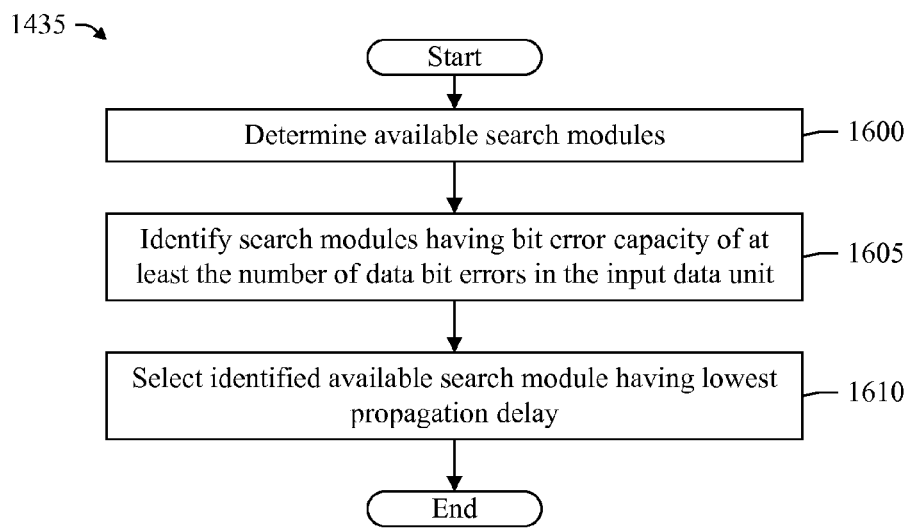
FIG. 16 is a flow chart for a portion of a method of correcting data bit errors, in accordance with an embodiment of the present invention.

FIG. 16 illustrates a portion of the method 1400 of correcting data bit errors in a data unit, in accordance with an embodiment of the present invention. The portion of the method 1400 illustrated in FIG. 15 is an embodiment of the step 1435 of the method 1400 in which a search module is selected based on the number of data bit errors in the input data unit. In step 1600, available search modules are identified. In various embodiments, the arbiter 1100 determines each available search module 165 in the search stage 160. For example, the arbiter 1100 may determine each search module 165 in the search stage 160 available to receive a locator polynomial 155. The portion of the method 1400 then proceeds to step 1605.

In step 1605, search modules having a bit error capacity of at least the number of data bit errors in the input data unit are identified. In various embodiments, the arbiter 1100 identifies each search module 165 in the search stage 160 having a bit error capacity of at least the number of data bit errors in the input data unit 120. In some embodiments, the arbiter 1100 identifies each available search module 165 in the search stage 160 having a bit error capacity of at least the number of data bit errors in the input data unit 120. The portion of the method 1400 then proceeds to step 1610.

In step 1610, an available identified search module having a lowest propagation delay is selected. In various embodiments, the arbiter 1100 selects an available identified search module 165 having a lowest propagation delay. For example, the arbiter 1100 may select a search module 165 having a lowest propagation delay from among search modules 165 determined to be available in step 1500 and identified as having a bit error capacity of at least the number of data bit errors in the input data unit 120 in step 1505. This portion of the method 1400 then ends.

In various embodiments, the portion of the method 1400 illustrated in FIG. 16 may include more or fewer than the steps 1600-1610 illustrated in FIG. 16 and described above. In some embodiments, the steps 1600-1610 of the portion of the method 1400 illustrated in FIG. 16 may be performed in a different order than the order illustrated in FIG. 16 and described above. For example, step 1605 may be performed before step 1600. In some embodiments, some of the steps 1600-1610 of the portion of the method 1400 illustrated in FIG. 16 may be performed in parallel or substantially simultaneously. In various embodiments, one or more of the steps 1600-1610 may be performed more than once in the portion of the method 1400 illustrated in FIG. 16.

Figure 17:
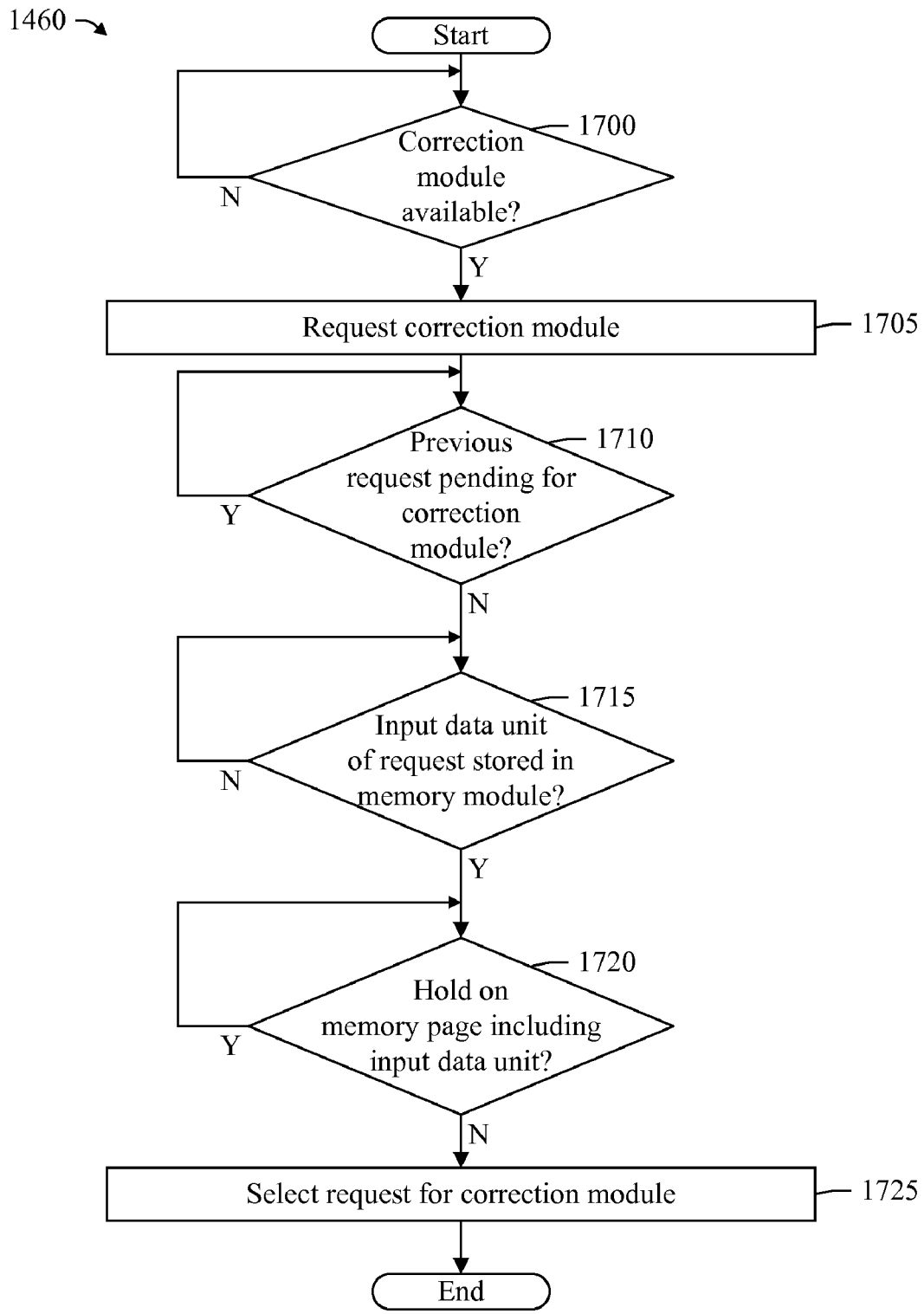
FIG. 17 is a flow chart for a portion of a method of correcting data bit errors, in accordance with an embodiment of the present invention.

FIG. 17 illustrates a portion of the method 1400 of correcting data bit errors in a data unit, in accordance with an embodiment of the present invention. The portion of the method 1400 illustrated in FIG. 17 is an embodiment of the step 1460 of the method 1400 in which a correction module is selected for the error indicator 170 associated with the input data unit 120. In step 1700, it is determined whether a correction module is available for correcting each data bit error in the input data unit. In various embodiments, the arbiter 1200 of the correction stage 175 determines whether a correction module 180 is available for correcting each data bit error in the input data unit 120. For example, the arbiter 1200 may identify a correction module 180 processing a memory page including the input data unit 120 and determine whether the correction module 180 is available to correct each data bit error in the input data unit 120. If it is determined that a correction module 180 is not available to correct each data bit error in the input data unit 120, the portion of the method 1400 returns to step 1700. Otherwise, the portion of the method 1400 proceeds to step 1705.

In step 1705, arrived at from the determination in step 1700 that a correction module is available to correct each data bit error in the input data unit, a request is issued for the correction module. In various embodiments, the arbiter 1200 issues a request for the correction module 180. The portion of the method 1400 then proceeds to step 1710.

In step 1710, it is determined whether a previous request for the correction module is pending. In various embodiments, the arbiter 1200 of the correction stage 175 determines whether a previous request for the correction module 180 is pending. If the arbiter 1200 determines that a previous request for the correction module 180 is pending, the portion of the method 1400 returns to step 1705. Otherwise, the portion of the method 1400 proceeds to step 1715.

In step 1715, arrived at from the determination in step 1710 that a previous request is not pending for the correction module, it is determined whether the input data unit of the request is stored in the memory module. In various embodiments, the arbiter 1200 of the correction stage 175 determines whether the input data unit 120 is stored in the memory module 195. If the arbiter 1200 determines the input data unit 120 is not stored in the memory module 195, the portion of the method 1400 returns to step 1715. Otherwise, the portion of the method 1400 proceeds to step 1720.

In step 1720, arrived at from the determination in step 1715 that the input data unit is stored in the memory module, it is determined whether the memory page including the input data unit has a hold. In various embodiments, the arbiter 1200 of the correction stage 175 determines whether the memory page including the input data unit 120 has a hold. For example, the memory page including the input data unit 120 may have a hold if the correction module 180 has not corrected each data bit error in a previous memory page received by the data correction system 100 from the data channel 115 associated with the input data unit 120. If the arbiter 1200 determines the memory page including the input data unit 120 has a hold, the portion of the method 1400 returns to step 1720. Otherwise, the portion of the method 1400 proceeds to step 1725.

In step 1725, arrived at from the determination in step 1720 that the memory page including the input data unit does not have a hold, the request for the correction module is selected. In various embodiments, the arbiter 1200 of the correction stage 175 selects the request for the correction module 180. This portion of the method 1400 then ends.

In various embodiments, the portion of the method 1400 illustrated in FIG. 17 may include more or fewer than the steps 1700-1725 illustrated in FIG. 17 and described above. In some embodiments, the steps 1700-1725 of the method 1400 illustrated in FIG. 17 may be performed in a different order than the order illustrated in FIG. 17 and described above. In some embodiments, some of the steps 1700-1725 of the portion of the method 1400 illustrated in FIG. 17 may be performed in parallel or substantially simultaneously. In various embodiments, one or more of the steps 1700-1725 may be performed more than once in the portion of the method 1400 illustrated in FIG. 17.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A system comprising:
a locator polynomial generator configured to receive a syndrome associated with an input data unit, generate a locator polynomial based on the syndrome, and determine a number of data bit errors in the input data unit based on the locator polynomial;
a plurality of search modules each having a respective bit error capacity for locating up to a predetermined number of data bit errors in a data unit based on a locator polynomial associated with the data unit, at least one search module of the plurality of search modules having a different bit error capacity than another search module of the plurality of search modules;
a first arbiter coupled to the locator polynomial generator and the plurality of search modules, the first arbiter configured to select a search module of the plurality of search modules having a bit error capacity for locating at least the number of data bit errors in the input data unit and to route the locator polynomial associated with the input data unit to the selected search module, the selected search module configured to generate an error indicator indicating a location of each data bit error in the input data unit based on the locator polynomial associated with the input data unit; and
a correction module coupled to the plurality of search modules and configured to correct each of the data bit errors in the input data unit based on the error indicator.

2. The system of claim 1, wherein the first arbiter is further configured to select the search module by determining each available search module of the plurality of search modules, identifying each available search module having a bit error capacity of at least the number of data bit errors in the input data unit, and selecting the identified available search module having a lowest bit error capacity.

3. The system of claim 1, wherein the first arbiter is further configured to select the search module by determining each available search module of the plurality of search modules, identifying each available search module having a bit error capacity of at least the number of data bit errors in the input data unit, and selecting the identified available search module having a lowest propagation delay.

4. The system of claim 1, further comprising a second arbiter coupled to the locator polynomial generator, the second arbiter configured to receive a plurality of syndromes from a plurality of data channels and route the plurality of syndromes to the locator polynomial generator.

5. The system of claim 1, further comprising a third arbiter coupled to the plurality of search modules and the correction module, the third arbiter configured to receive a plurality of error indicators from a plurality of search modules and route the plurality of error indicators to the correction module.

6. The system of claim 1, further comprising:
a plurality of locator polynomial generators coupled to the first arbiter; and a second arbiter coupled to the plurality of locator polynomial generators, the second arbiter configured to receive a plurality of syndromes from a plurality of data channels, select a locator polynomial generator of the plurality of locator polynomial generators for each syndrome of the plurality of syndromes, and route each syndrome of the plurality of syndromes to the locator polynomial generator selected for the syndrome.

7. The system of claim 6, wherein the plurality of data channels is divided into a plurality of partitions each associated with a locator polynomial generator of the plurality of locator polynomial generators, and the second arbiter is further configured to receive a plurality of descriptors corresponding to the plurality of syndromes, each descriptor of the plurality of descriptors identifying a data channel of the plurality of data channels, and wherein the second arbiter is further configured to route each syndrome of the plurality of syndromes to the locator polynomial generator associated with the partition including the data channel identified by the descriptor corresponding to the syndrome.

8. The system of claim 6, further comprising:
a plurality of correction modules; and
a third arbiter coupled to the plurality of search modules and the plurality of correction modules, the third arbiter configured to receive a plurality of error indicators generated by the plurality of search modules, select a correction module of the plurality of correction modules for each error indicator of the plurality of error indicators, and route each error indicator of the plurality of error indicators to the correction module selected for the error indicator.

9. The system of claim 8, wherein the plurality of data channels is divided into a plurality of partitions each associated with a correction module of the plurality of correction modules, and the third arbiter is further configured to receive a plurality of descriptors corresponding to the plurality of error indicators, each descriptor of the plurality of descriptors identifying a data channel of the plurality of data channels, and wherein the third arbiter is further configured to route each error indicator of the plurality of error indicators to the correction module associated with the partition including the data channel identified by the descriptor corresponding to the error indicator.

10. The system of claim 1, further comprising:
a plurality of syndrome generators coupled to a second arbiter and configured to generate a plurality of syndromes corresponding to the plurality of input data units and receive a plurality of memory pages each including at least two input data units of a plurality of input data units;
a memory module configured to store the plurality of memory pages; and
a scoreboard configured to maintain a status of each memory page of the plurality of memory pages stored in the memory module indicating whether each data bit error in the memory page is corrected.

11. The system of claim 10, wherein the locator polynomial generator is further configured to receive a descriptor corresponding to the syndrome, and wherein the descriptor is configured to identify a data channel associated with the syndrome, the memory page including the input data unit associated with the syndrome, and the input data unit associated with the syndrome.

12. A system comprising:
a locator polynomial generator configured to receive a syndrome associated with an input data unit, generate a locator polynomial based on the syndrome, and determine a number of data bit errors in the input data unit based on the locator polynomial;
a plurality of search modules each having a respective bit error capacity for locating up to a predetermined number of data bit errors in a data unit based on a locator polynomial associated with the data unit, at least one search module of the plurality of search modules having a maximum bit error capacity;
a first arbiter coupled to the locator polynomial generator and the plurality of search modules, the first arbiter configured to select a search module of the plurality of search modules having a bit error capacity of at least the number of data bit errors in the input data unit and to route the locator polynomial associated with the input data unit to the selected search module, the selected search module having a bit error capacity being less than the maximum bit error capacity and configured to generate an error indicator indicating a location of each data bit error in the input data unit based on the locator polynomial associated with the input data unit; and
a correction module coupled to the plurality of search modules and configured to correct each of the data bit errors in the input data unit based on the error indicator.

13. The system of claim 12, wherein the first arbiter is further configured to select the search module by determining each available search module of the plurality of search modules, identifying each available search module having a bit error capacity of at least the number of data bit errors in the input data unit, and selecting the identified available search module having a lowest bit error capacity.

14. The system of claim 12, wherein the first arbiter is further configured to select the search module by determining each available search module of the plurality of search modules, identifying each available search module having a bit error capacity of at least the number of data bit errors in the input data unit, and selecting the identified available search module having a lowest propagation delay.

15. The system of claim 12, further comprising:
a plurality of locator polynomial generators coupled to the second arbiter and the first arbiter; and
a second arbiter coupled to the plurality of locator polynomial generators, the second arbiter configured to receive a plurality of syndromes from a plurality of data channels, select a locator polynomial generator of the plurality of locator polynomial generators for each syndrome of the plurality of syndromes, and route each syndrome of the plurality of syndromes to the locator polynomial generator selected for the syndrome.

16. The system of claim 13, further comprising:
a plurality of correction modules; and
a third arbiter coupled to the plurality of search modules and the plurality of correction modules, the third arbiter configured to receive a plurality of error indicators generated by the plurality of search modules, select a correction module of the plurality of correction modules for each error indicator of the plurality of error indicators, and route each error indicator of the plurality of error indicators to the correction module selected for the error indicator.

17. The system of claim 16, further comprising:
a plurality of syndrome generators coupled to a second arbiter and configured to generate a plurality of syndromes corresponding to the plurality of input data units and receive a plurality of memory pages each including at least two input data units of a plurality of input data units;

a memory module configured to store the plurality of memory pages; and a scoreboard configured to maintain a status of each memory page of the plurality of memory pages stored in the memory module indicating whether each data bit error in the memory page is corrected.

18. The system of claim 17, wherein the locator polynomial generator is further configured to receive a descriptor corresponding to the syndrome, the descriptor configured to identify a data channel associated with the syndrome, the memory page including the input data unit associated with the syndrome, and the input data unit associated with the syndrome.

19. A method comprising:

receiving a syndrome associated with an input data unit;

generating a locator polynomial based on the syndrome;

determining a number of data bit errors in the input data unit based on the locator polynomial;

selecting a search module of a plurality of search modules based on the number of data bit errors in the input data unit, each search module of the plurality of search modules having a respective bit error capacity for locating up to a predetermined number of data bit errors in a data unit based on a locator polynomial associated with the input data unit, the selected search module having a bit error capacity of at least the number of data bit errors in the input data unit;

routing the locator polynomial associated with the input data unit to the selected search module;

generating a error indicator indicating a location of each data bit error in the input data unit based on the locator polynomial associated with the input data unit; and correcting each of the data bit errors in the input data unit based on the error indicator.

20. The method of claim 19, wherein at least one search module of the plurality of search modules has a maximum bit error capacity, and wherein the selected search module has a bit error capacity being less than the maximum bit error capacity.

21. The method of claim 20, wherein selecting the search module comprises:

determining at least one available search module of the plurality of search modules;

identifying at least one available search module having a bit error capacity of at least the number of data bit errors in the input data unit; and selecting an identified available search module having a lowest bit error capacity.

22. The method of claim 20, wherein selecting the search module comprises:

determining at least one available search module of the plurality of search modules;

identifying at least one available search module having a bit error capacity of at least the number of data bit errors in the input data unit; and selecting an identified available search module having a lowest propagation delay.

* * * * *

UNITED STATES PATENT AND TRADEMARK OFFICE
CERTIFICATE OF CORRECTION

PATENT NO. : 8,397,144 B1  
APPLICATION NO. : 12/913716  
DATED : March 12, 2013  
INVENTOR(S) : Christopher I. W. Norrie et al.

Page 1 of 1

It is certified that error appears in the above-identified patent and that said Letters Patent is hereby corrected as shown below:

In the Specification:

Column 12, line 11, replace "element a" with --element α--.

Column 12, line 27, replace "element a" with --element α--.

Signed and Sealed this  
Twenty-ninth Day of October, 2013

Teresa Stanek Rea  
*Deputy Director of the United States Patent and Trademark Office*